United States Patent
Anderson et al.

(10) Patent No.: US 9,264,091 B2
(45) Date of Patent: Feb. 16, 2016

(54) MIXER UNIT

(75) Inventors: Martin Anderson, Löddeköpinge (SE); Henrik Sjöland, Lund (SE); Lars Sundström, Södra Sandby (SE); Jim Svensson, Stockholm (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/346,103
(22) PCT Filed: Sep. 14, 2012
(86) PCT No.: PCT/SE2012/050972
§ 371 (c)(1),
(2), (4) Date: May 15, 2014
(87) PCT Pub. No.: WO2013/043106
PCT Pub. Date: Mar. 28, 2013

(65) Prior Publication Data
US 2015/0110161 A1    Apr. 23, 2015

Related U.S. Application Data

(60) Provisional application No. 61/539,227, filed on Sep. 26, 2011.

(30) Foreign Application Priority Data
Sep. 23, 2011    (EP) .................................. 11182531

(51) Int. Cl.
H04B 1/26    (2006.01)
H04B 1/405    (2015.01)
(Continued)

(52) U.S. Cl.
CPC ............... *H04B 1/405* (2013.01); *H03D 7/165* (2013.01); *H03D 7/18* (2013.01); *H04L 27/12* (2013.01)

(58) Field of Classification Search
CPC ............. G06F 7/44; G06F 7/556; H03D 7/14; H04B 1/10; H04B 1/16; H04B 1/26; H04B 1/28; H04B 1/109; H04B 1/126; H04B 7/00; H04L 25/06; H04L 25/03878; H04L 27/00; H04L 27/06; H04L 27/18
USPC ............ 327/94, 116, 355–361, 554; 375/219, 375/229, 235, 295, 297, 298, 316, 319, 327, 375/345; 455/73, 127.3, 139, 197.3, 209, 455/226.1, 296, 326, 333
See application file for complete search history.

(56) References Cited

U.S. PATENT DOCUMENTS 6,711,397 B1    3/2004    Petrov et al.
7,277,682 B2 *  10/2007   Zhou .......................... 455/127.1
(Continued)

FOREIGN PATENT DOCUMENTS

EP    2333949 A1    6/2011
WO    0019653 A1    4/2000
(Continued)

OTHER PUBLICATIONS

Bautista, E. E. et al., "A High IIP2 Downconversion Mixer Using Dynamic Matching," IEEE Journal of Solid-State Circuits. Dec. 2000. pp. 1934-1941. vol. 35, No. 12.

*Primary Examiner* — Sam K Ahn
*Assistant Examiner* — Shawkat M Ali
(74) *Attorney, Agent, or Firm* — Murphy, Bilak & Homiller, PLLC

(57) ABSTRACT

A mixer unit (30) for frequency translating, based on an LO signal, an input signal having one or more input signal components is disclosed. The mixer unit has a signal processing path (50a-d, 60a-d) from each Input terminal (32+, 32−) to each output terminal (34_I+, 34_I−, 34_Q+,34_Q−) of the mixer unit (30), The LO signal has an associated LO signal component (LO_Ia-d, LO_Qa-d) for each signal processing path. The mixer unit (30) comprises a plurality of mixer switches (70a-N) and a control unit (90). The control unit (90) is adapted to, for each signal processing path (50a-d, 60a-d), dynamically select an associated subset, in the following denoted active switch subset, of the plurality of mixer switches (70a-N) for operation in the signal processing path (50a-d, 60a~d) such that which of the plurality of mixer switches (70a-N) belong to said active switch subset varies in time. At any instant in time, the union of all the active switch subsets is a strict subset, denoted combined active subset, of the plurality of mixer switches (70a-N). The control unit (90) is further adapted to activate only the mixer switches (70a-N) in said combined active subset by, for each mixer switch (70a-N) in the combined active subset, supplying the corresponding LO signal component to the mixer switch. A related radio receiver circuit (10), a related radio communication apparatus (1, 2), and a related method are also disclosed.

16 Claims, 10 Drawing Sheets

(51) Int. Cl.
*H03D 7/16* (2006.01)
*H03D 7/18* (2006.01)
*H04L 27/12* (2006.01)

(56) References Cited

U.S. PATENT DOCUMENTS

| | | | |
|---|---|---|---|
| 7,457,606 B2* | 11/2008 | Kim | 455/323 |
| 7,671,658 B2* | 3/2010 | Harada et al. | 327/355 |
| 7,737,760 B2* | 6/2010 | Lai | 327/355 |
| 7,750,749 B2* | 7/2010 | Jones | 332/105 |
| 8,428,544 B2* | 4/2013 | Heck et al. | 455/323 |
| 2004/0259519 A1* | 12/2004 | Su | 455/326 |
| 2005/0164671 A1* | 7/2005 | Darabi | 455/333 |
| 2006/0014515 A1 | 1/2006 | Ruelke et al. | |
| 2007/0066269 A1* | 3/2007 | Kivekas et al. | 455/326 |
| 2008/0003973 A1* | 1/2008 | Vaisanen | 455/326 |
| 2008/0139149 A1 | 6/2008 | Mu et al. | |
| 2008/0284487 A1* | 11/2008 | Pullela et al. | 327/355 |
| 2009/0197552 A1* | 8/2009 | Kurahashi et al. | 455/196.1 |
| 2010/0081408 A1* | 4/2010 | Mu et al. | 455/326 |
| 2010/0117712 A1* | 5/2010 | Huang et al. | 327/361 |
| 2010/0171542 A1* | 7/2010 | Dawe et al. | 327/355 |
| 2010/0253412 A1* | 10/2010 | Brekelmans et al. | 327/361 |
| 2011/0063013 A1* | 3/2011 | Kim et al. | 327/355 |
| 2011/0201289 A1 | 8/2011 | Rafi et al. | |
| 2013/0028356 A1* | 1/2013 | Heck et al. | 375/344 |

FOREIGN PATENT DOCUMENTS

| | | |
|---|---|---|
| WO | 2009057051 A2 | 5/2009 |
| WO | 2009059831 A2 | 5/2009 |

* cited by examiner

MIXER UNIT

TECHNICAL FIELD

The present invention relates to a mixer unit for frequency translation of an input signal.

BACKGROUND

The homodyne (or direct conversion) receiver architecture is commonly used in wireless devices like mobile phones, enabling a low cost to be achieved. In this receiver architecture, the incoming radio frequency (RF) signal is converted to a baseband signal in a single frequency conversion step. This type of receiver is therefore relatively sensitive to low frequency disturbances generated by the mixer at its output. Some of these disturbances are due to mismatches in the mixer, like even order distortion and DC-offset, while another problem is low frequency flicker noise (1/f noise), generated in the mixer switches.

To avoid flicker noise, it is common to use passive mixers in homodyne receivers. Furthermore, quadrature down-conversion is normally used in homodyne receivers to keep the phase information of the signal. A passive mixer where mixer switches are driven by 25% duty cycle square wave is often used. The 25% duty cycle assures that just one mixer switch is closed at a time, minimizing harmful interaction within the mixer. The passive mixer also has the advantage of relatively low (or "almost zero") power consumption in the mixer itself, but the local oscillator (LO) driver supplying the 25% duty cycle signals to the mixer switches instead consumes considerable power.

Mismatch in the switches causes even order distortion. The required second order input referred intercept point (IIP2) is relatively high in homodyne cellular phone receivers, e.g. with numbers in the order of +50 dBm referred to the antenna input. This makes it necessary to use relatively large mixer switches (e.g. large transistors) to achieve sufficient matching, resulting in a relatively high capacitive load of the LO-driver. Because the power consumption of the LO-driver is proportional to the capacitive load, this results in relatively high power consumption. This is unwanted, because low power consumption is often desirable in mobile phones and other wireless devices.

SUMMARY

An object of the embodiments of the present invention is to facilitate frequency translation of a signal at relatively low power consumption.

According to a first aspect, there is provided a mixer unit for frequency translating, based on a local oscillator (LO) signal, an input signal having one or more input signal components. The mixer unit comprises an input port for receiving the input signal, wherein the input port has an input terminal for each input signal component. Furthermore, the mixer unit comprises an output port for outputting a frequency translated output signal having one or more output signal components, wherein the output port has an output terminal for each output signal component. The mixer unit further has a signal processing path from each input terminal to each output terminal. The LO signal has an associated LO signal component for each signal processing path, and the LO signal components have the same LO frequency. The mixer unit further comprises a plurality of mixer switches and a control unit. The control unit is adapted to, for each signal processing path, dynamically select an associated subset, in the following denoted active switch subset, of the plurality of mixer switches for operation in the signal processing path such that which of the plurality of mixer switches belong to said active switch subset varies in time. At any instant in time (during operation of the mixer unit), the union of all the active switch subsets is a strict subset, in the following denoted combined active subset, of the plurality of mixer switches. The control unit is further adapted to activate only the mixer switches in said combined active subset by, for each mixer switch in the combined active subset, supplying, to the mixer switch, the LO signal component associated with the signal processing path in which that mixer switch is operated. That is, those, and only those, of the mixer switches that are currently in the combined active subset are activated by the control unit.

Some embodiments are such that each active switch subset at any instant in time consists of exactly one mixer switch.

The control unit may be adapted to, for each one of two or more of the signal processing paths dynamically select which of the mixer switches are currently operated in that signal processing path in a time-periodic sequence associated with the signal processing path. The time periodic sequences associated with the two or more of the signal processing paths may have mutually different periods.

The input signal may be a differential input signal having a first and a second input signal component. The input port may then be a differential input port comprising a first input terminal for receiving the first input signal component and a second input terminal for receiving the second input signal component. The output signal may comprise one or more differential output signal pairs, wherein each differential output signal pair comprises a first output signal component of the differential output signal pair and a second output signal component of the differential output signal pair. For each such differential output signal pair, the output port may comprise a corresponding differential output terminal pair having a first output terminal of the differential output terminal pair for outputting the first output signal component of the differential output signal pair, and a second output terminal of the differential output terminal pair for outputting the second output signal component of the differential output signal pair.

Some embodiments may be such that, for each differential output terminal pair, there is an associated signal processing path group of four signal processing paths, namely a first signal processing path, which is the signal processing path from the first input terminal to the first output terminal of the differential output terminal pair, a second signal processing path, which is the signal processing path from the first input terminal to the second output terminal of the differential output terminal pair, a third signal processing path, which is the signal processing path from the second input terminal to the first output terminal of the differential output terminal pair, and a fourth signal processing path, which is the signal processing path from the second input terminal to the second output terminal of the differential output terminal pair.

Furthermore, some embodiments may be such that, for each signal processing path group, the LO signal component associated with the first signal processing path of the signal processing path group and the LO signal component associated with the fourth signal processing path of the signal processing path group are both generated equal to a first LO signal component associated with the signal processing path group, and the LO signal component associated with the second signal processing path of the signal processing path group and the LO signal component associated with the third signal processing path of the signal processing path group are both generated equal to a second LO signal component associated with the signal processing path group. The first and the second LO signal component associated with the signal processing path group may together form a differential LO signal component of the signal processing path group.

The output signal may comprise a plurality of differential output signal pairs, and consequently a plurality of associated differential output terminal pairs and a plurality of associated signal processing path groups. The differential LO signal components of the signal processing path groups may have mutually shifted phases. For example, the mixer unit may be a quadrature mixer unit having two differential output signal pairs, wherein one differential output signal pair is an in-phase (I) differential output signal pair, for which there are an associated I differential output terminal pair and an associated I signal processing path group, and the other differential output signal pair is a quadrature-phase (Q) differential output signal pair, for which there are an associated Q differential output terminal pair and an associated Q signal processing path group, and wherein the differential LO signal components of the I and Q signal processing paths are generated in quadrature.

At least some of the mixer switches may be grouped into double balanced passive mixers, each comprising four mixer switches. The control unit may be adapted to dynamically select the active switch subsets such that, for each such double balanced passive mixer each mixer switch of that double balanced passive mixer belongs to the combined active subset if and only if the other mixer switches of that double balanced passive mixer also belongs to the combined active subset, and all mixer switches of the double balanced mixer are then operated in signal processing paths of a signal processing path group that is common to the mixer switches of the double balanced passive mixer. Some embodiments may be such that, for each double balanced passive mixer, said signal processing path group common to the mixer switches of the double-balanced passive mixer is the same each time the control unit selects the mixer switches of the double balanced passive mixer for inclusion in the combined active subset. Other embodiments may be such that for each double balanced passive mixer, said signal processing path group common to the mixer switches of the double-balanced passive mixer varies in time.

Each double balanced passive mixer may have a first and a second active mode. In the first active mode, a first mixer switch of the double balanced passive mixer may be operated in the first signal processing path of the signal processing path group common to the mixer switches of the double-balanced passive mixer, a second mixer switch of the double balanced passive mixer may be operated in the second signal processing path of the signal processing path group common to the mixer switches of the double-balanced passive mixer, a third mixer switch of the double balanced passive mixer may be operated in the third signal processing path of the signal processing path group common to the mixer switches of the double-balanced passive mixer, and a fourth mixer switch of the double balanced passive mixer may be operated in the fourth signal processing path of the signal processing path group common to the mixer switches of the double-balanced passive mixer. In the second active mode, the first mixer switch of the double balanced passive mixer may be operated in the second signal processing path of the signal processing path group common to the mixer switches of the double-balanced passive mixer, the second mixer switch of the double balanced passive mixer may be operated in the first signal processing path of the signal processing path group common to the mixer switches of the double-balanced passive mixer, the third mixer switch of the double balanced passive mixer may be operated in the fourth signal processing path of the signal processing path group common to the mixer switches of the double-balanced passive mixer, and the fourth mixer switch of the double balanced passive mixer may be operated in the third signal processing path of the signal processing path group common to the mixer switches of the double-balanced passive mixer. The control unit may be adapted to dynamically select which active mode of the first and the second active mode the double balanced passive mixer is set to operate in when the mixer switches of the double balanced passive mixer are selected by the control unit for inclusion in the combined active subset such that the active mode varies in time.

Some embodiments may be such that, for each mixer switch, every time that mixer switch belongs to the combined active subset, that mixer switch is always operated in the same one of the signal processing paths.

According to a second aspect, there is provided a radio receiver circuit comprising the mixer unit according to the first aspect. The radio receiver circuit may e.g. be a homodyne radio receiver circuit.

According to a third aspect, there is provided a radio communication apparatus comprising the radio receiver circuit according to the second aspect. The radio communication apparatus may e.g. be, but is not limited to, a mobile terminal, a wireless data modem, or a radio base station.

According to a fourth aspect, there is provided a method of controlling a mixer unit for frequency translating, based on an LO signal, an input signal having one or more input signal components. The mixer unit comprises an input port for receiving the input signal, wherein the input port has an input terminal for each input signal component. Furthermore, the mixer unit comprises an output port for outputting a frequency translated output signal having one or more output signal components, wherein the output port has an output terminal for each output signal component. The mixer unit further has a signal processing path from each input terminal to each output terminal. The LO signal has an associated LO signal component for each signal processing path, and the LO signal components have the same LO frequency. The mixer unit further comprises a plurality of mixer switches. The method comprises, for each signal processing path, dynamically selecting an associated subset, in the following denoted active switch subset, of the plurality of mixer switches for operation in the signal processing path such that which of the plurality of mixer switches belong to said active switch subset varies in time, and, for any instant in time, the union of all the active switch subsets is a strict subset, in the following denoted combined active subset, of the plurality of mixer switches. The method further comprises activating only the mixer switches in said combined active subset by, for each mixer switch in the combined active subset, supplying, to the mixer switch, the LO signal component associated with the signal processing path in which that mixer switch is operated. That is, those, and only those, of the mixer switches that are currently in the combined active subset are activated.

The dynamic selection of mixer switches according to embodiments of the present invention provides for a dynamic matching effect that facilitates meeting intermodulation distortion requirements with smaller mixer switches than would have been required with a conventional mixer unit, which in turn facilitates a reduction of power consumption compared with such a conventional mixer unit.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

The inventors have realized that a reduction of power consumption can be facilitated by introducing a redundancy in terms of mixer switches in a mixer unit and to apply dynamic matching techniques to the mixers switches, thereby reducing the low frequency disturbances at the output of the mixer. Instead of a few relatively large mixer switches that are always active, a larger number of smaller mixer switches that take turns in being active are utilized in embodiments of the present invention. That is, not all of these mixer switches are operated simultaneously (all at the same time), but are operated alternatingly, e.g. according to some sequence. Thus, some, but not all, mixer switches are operated at a time by providing LO signals to them. The sequence of activation could follow a fixed pattern or be random. In some embodiments, all mixers switches are active (or operated) roughly an equal part of the time. Qualitatively speaking, if the rate of the activation sequence (below referred to as dynamic selection rate) is high enough, in-channel signals will experience an effective intermodulation distortion which will then be roughly the average of that introduced by each of the smaller mixer switches. This is similar to the intermodulation of all mixer switches operated simultaneously (which in turn corresponds to using larger mixer switches). However, compared with operating all mixer switches simultaneously, the required LO-driver power will be scaled with a scaling factor equal to the ratio between the number of simultaneously operated mixer switches and the total number of mixer switches (and thus reduced, since the scaling factor is less than 1).

A further improvement may be achieved with various variations of what is referred to below as phase scrambling. In this way, a particular mixer switch (when operated) will not always operate in the same LO signal phase, but will alternate between different LO signal phases. This results in higher redundancy than if each mixer switch would always operate in the same LO signal phase).

Mixer switches, and other switches, described herein may be implemented with transistors, such as metal-oxide-semiconductor field-effect transistors (MOSFETs) or bipolar junction transistors (BJTs). Using transistors as switches is, per se, well known in the art of electronics and is not further describer herein in greater detail.

Figure 1:
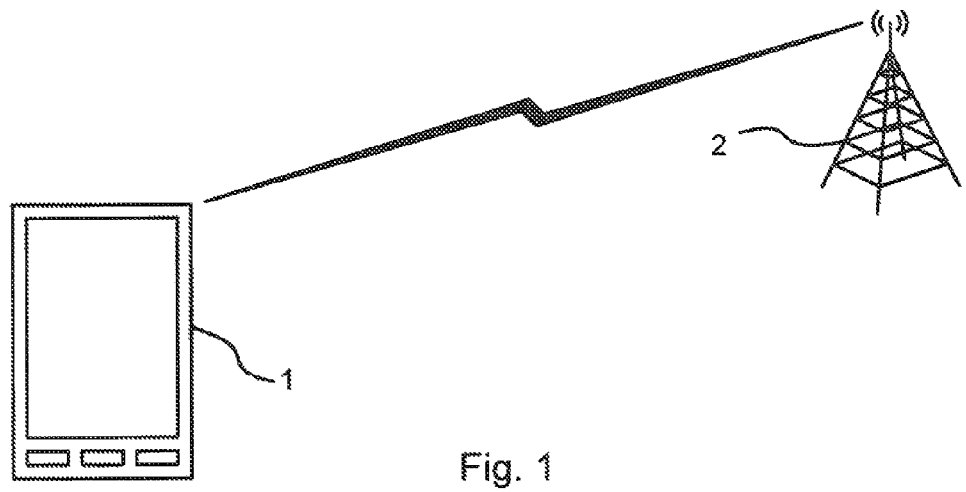
FIG. 1 schematically illustrates a mobile terminal in communication with a radio base station.

FIG. 1 illustrates schematically an environment in which embodiments of the present invention may be employed. In FIG. 1, a mobile terminal 1, illustrated in FIG. 1 as a mobile, or cellular, telephone 1, is in wireless communication with a radio base station 2, e.g. in a cellular communication network. The mobile telephone 1 and the radio base station 2 are nonlimiting examples of what is referred to below generically with the term radio communication apparatus. Another nonlimiting example of such a radio communication apparatus is a wireless data modem, e.g. a wireless data modem to be used in a cellular communication network. Embodiments of the present invention may also be employed in radio communication apparatuses for operation in other types of communication networks, such as but not limited to wireless local area networks (WLANs) and personal area networks (PANs).

Figure 2:
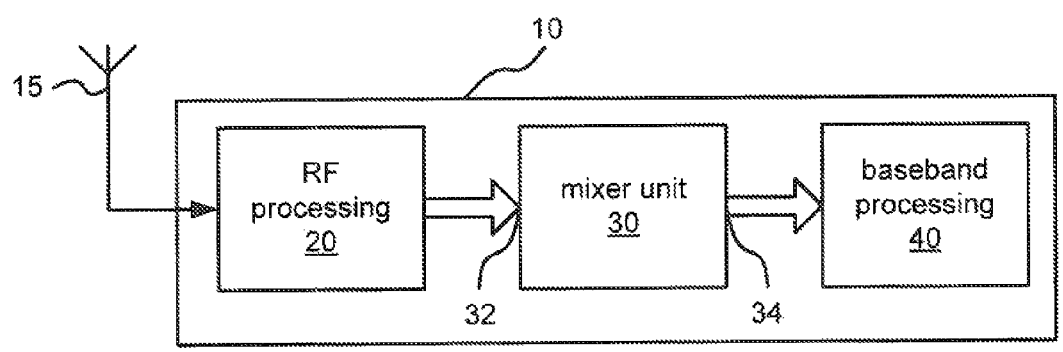
FIG. 2 shows a simplified block diagram of a radio receiver circuit according to some embodiments of the present invention.

Such radio communication apparatuses may comprise one or more radio receiver circuits. An example of such a radio receiver circuit is briefly described below with reference to FIG. 2. FIG. 2 is a simplified block diagram of a radio receiver circuit 10 according to an embodiment of the present invention. In FIG. 2, the radio receiver circuit 10 is connected to an antenna 15 for receiving electromagnetic radio frequency (RF) signals. Although a single antenna 15 is shown in FIG. 2, multiple antennas may well be used in other embodiments. In the embodiment illustrated in FIG. 2, the radio receiver circuit comprises RF processing circuitry 20 for operative connection to the antenna 15. The RF processing circuitry 20 is adapted to perform (analog) signal processing on RF signals from the antenna 15. The RF processing circuitry may comprise one or more filters, low-noise amplifiers (LNAs), transformers (e.g. balun transformers), and/or other circuitry for processing of RF signals. Such circuitry is, per se, well known in the art of radio receivers and is therefore not further described herein in greater detail.

Furthermore, the embodiment of the radio receiver circuit 10 illustrated in FIG. 2 comprises a mixer unit 30 for frequency translation of an input signal (in this particular context generated by the RF processing circuitry 20) having one or more input signal components. For example, a single-ended input signal would have one input signal component, a differential input signal would have two input signal component (one positive and one negative), etc. Such frequency translation is based on a local oscillator (LO) signal, and may be referred to as "mixing the input signal with the LO signal". The mixer unit 30 has an input port 32 for receiving the input signal. The input port 32 has an input terminal for each input signal component. Furthermore, the mixer unit 30 has an output port 34 for outputting a frequency translated output signal (i.e., the result of the mixing operation) having one or more output signal components. For example, a real-valued single-ended output signal would have one output signal component, a real-valued differential output signal would have two output signal components (one positive and one negative), a single-ended quadrature output signal would have two output signal components (one in-phase, or "I", component and one quadrature-phase, or "Q", component), a differential quadrature output signal would have four output signal components (one positive I component, one negative I component, one positive Q component, and one negative Q component). The output port 34 has an output terminal for each output signal component. Various embodiments of the mixer unit 30 are described in further detail below.

The embodiment of the radio receiver circuit 10 illustrated in FIG. 2 is assumed to be a homodyne radio receiver circuit. Thus, the radio receiver circuit 2 comprises baseband processing circuitry 40 operatively connected to the output port 34 of the mixer unit 30 for processing the output signal from the mixer unit 30. However, embodiments of the mixer unit 30 described herein are applicable in other types of radio receiver circuits as well, e.g. radio receiver circuits wherein frequency translation is performed in one or more steps to one or more (non-zero) intermediate frequencies (IFs).

The baseband processing circuitry 40 may comprise one or more filters, amplifiers, analog-to-digital converters, digital signal processors, and/or other circuitry for processing of baseband signals. Such circuitry is, per se well known in the art of radio receivers and is therefore not further described herein in greater detail.

According to embodiments, the mixer unit 30 has a signal processing path (50a-d, 60a-d) from each input terminal (32+, 32−) to each output terminal (34_I+, 34_I−, 34_Q+, 34_Q−). The LO signal has an associated LO signal component (LO_Ia-d, LO_Qa-d) for each signal processing path. The LO signal components (LO_Ia-d, LO_Qa-d) have the same LO frequency. For each signal processing path, the signal processing path may be arranged to forward an input signal on the corresponding input terminal to the corresponding output terminal during a first state, or "on state", of the associated LO signal component. The signal processing path may be said to be conductive during the on state of the associated LO signal component. Furthermore, for each signal processing path, the signal processing path may be arranged to block an input signal on the corresponding input terminal from propagating to the corresponding output terminal during a second state, or "off state", of the associated LO signal component. The signal processing path may be said to be non-conductive during the off state of the associated LO signal component. This may be accomplished by means of operating a mixer switch in the signal processing path such that the mixer switch is closed during the on state of the associated LO signal component and open during the off state of the associated LO signal component. These concepts are illustrated below with reference to FIGS. 3-4.

Figure 3:
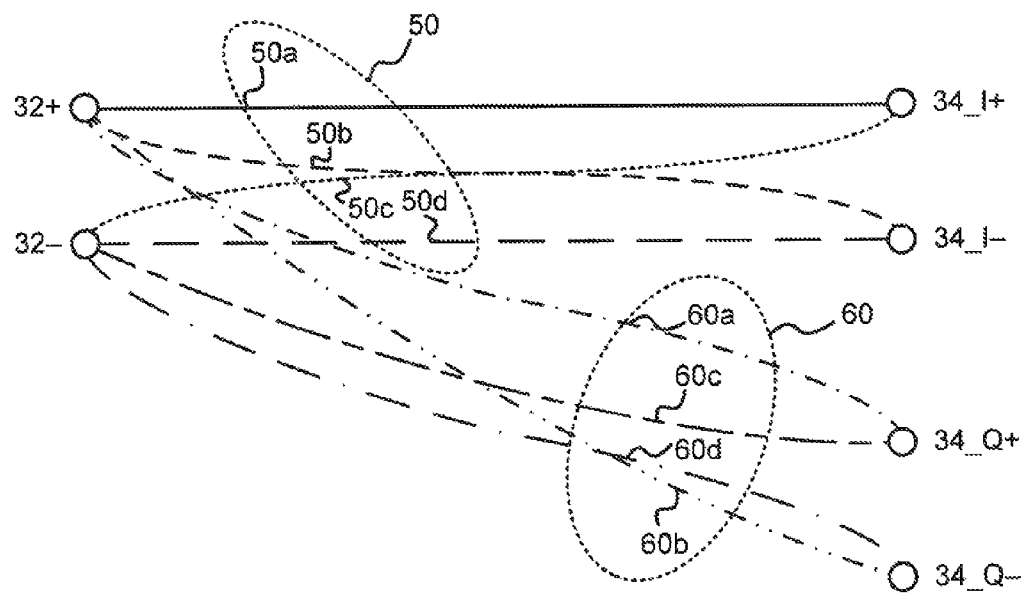
FIG. 3 illustrates signal processing paths of a mixer unit according to an example.

FIG. 3 illustrates signal processing paths of an embodiment of the mixer unit 30. In the embodiment illustrated with FIG. 3, the mixer unit 30 has a differential input signal. Thus, the input port 32 has two input terminals; a positive input terminal 32+ and a negative input terminal 32−. Furthermore, in the embodiment illustrated with FIG. 3, the mixer unit 30 has a differential quadrature output signal. Thus, output port 34 has four output terminals; a positive I output terminal 34_I+, a negative I output terminal 34_I−, a positive Q output terminal 34_Q+, and a negative Q output terminal 34_Q−. This type of mixer unit may be referred to as a fully differential quadrature mixer unit, and is used as an elucidating, but nonlimiting, example in this detailed description. Such a fully differential quadrature mixer unit is a special case of a more general concept referred to below as a fully differential mixer unit. For such a fully differential mixer unit, the input signal is a differential input signal having a first (e.g. positive) and a second (e.g negative) input signal component. Furthermore, for such a fully differential mixer unit, the input port 32 is a differential input port comprising a first input terminal (e.g. 32+ in FIG. 3) for receiving the first input signal component and a second input terminal (e.g. 32− in FIG. 3) for receiving the second input signal component. Moreover, for such a fully differential mixer unit, the output signal comprises one or more differential output signal pairs (for the fully differential quadrature mixer unit illustrated with FIG. 3, there are two such differential output signal pairs; one I output signal pair and one Q output signal pair). Each differential output signal pair comprises a first (e.g. positive) output signal component of the differential output signal pair and a second (e.g. negative) output signal component of the differential output signal pair. For each such differential output signal pair, the output port comprises a corresponding differential output terminal pair. Each such differential output terminal pair has a first (e.g. positive) output terminal (e.g. 34_I+ or 34_Q+ in FIG. 3) of the differential output terminal pair for outputting the first output signal component of the differential output signal pair, and a second (e.g. negative) output terminal (e.g. 34_I− or 34_Q−) of the differential output terminal pair for outputting the second output signal component of the differential output signal pair.

In FIG. 3, the signal processing path from the input terminal 32+ to the output terminal 34_I+ is labeled 50a, the signal processing path from the input terminal 32+ to the output terminal 34_I− is labeled 50b, the signal processing path from the input terminal 32− to the output terminal 34_I+ is labeled 50c, and the signal processing path from the input terminal 32− to the output terminal 34_I− is labeled 50d. Similarly, the signal processing path from the input terminal 32+ to the output terminal 34_Q+ is labeled 60a, the signal processing path from the input terminal 32+ to the output terminal 34_Q− is labeled 60b, the signal processing path from the input terminal 32− to the output terminal 34_Q+ is labeled 60c, and the signal processing path from the input terminal 32− to the output terminal 34_Q− is labeled 60d.

Returning to the more general concept of the fully differential mixer unit, of which the fully differential quadrature mixer unit illustrated with FIG. 3 is a specific example, the following grouping of signal processing paths is convenient for defining some embodiments of the mixer unit 30. According to this grouping, for each differential output terminal pair of the fully differential mixer unit, there is an associated signal processing path group of four signal processing paths, in the following referred to as a first signal processing path of the signal processing path group, a second signal processing path of the signal processing path group, a third signal processing path of the signal processing path group, and a fourth signal processing path of the signal processing path group. The first signal processing path (e.g. 50a or 60a in FIG. 3) is the signal processing path from the first input terminal (e.g. 32+ in FIG. 3) to the first output terminal (e.g. 34_I+ or 34_Q+ in FIG. 3) of the differential output terminal pair. The second signal processing path (e.g. 50b or 60b in FIG. 3) is the signal processing path from the first input terminal (e.g. 32+ in FIG. 3) to the second output terminal (e.g. 34_I− or 34_Q− in FIG. 3) of the differential output terminal pair. The third signal processing path (e.g. 50c or 60c in FIG. 3) is the signal processing path from the second input terminal (e.g. 32− in FIG. 3) to the first output terminal (e.g. 34_I+ or 34_Q+ in FIG. 3) of the differential output terminal pair. The fourth signal processing path (e.g. 50d or 60d in FIG. 3) is the signal processing path from the second input terminal (e.g. 32− in FIG. 3) to the second output terminal (e.g. 34_I− or 34_Q− in FIG. 3) of the differential output terminal pair. In a "traditional" mixer, wherein each signal processing path comprises a single fixed mixer switch, such a signal processing path group would correspond to a passive double-balanced mixer. Referring to FIG. 3, the signal processing path group comprising the signal processing paths 50a-d is in the following referred to as the I signal processing path group 50. Similarly, the signal processing path group comprising the signal processing paths 60a-d is in the following referred to as the Q signal processing path group 60.

Figure 4:
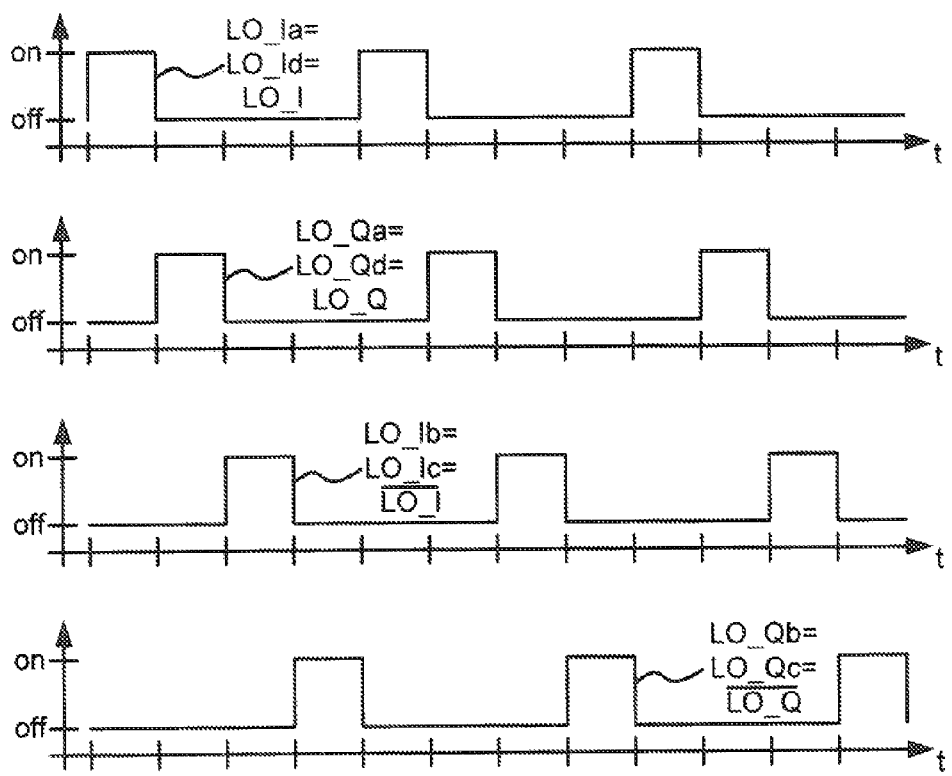
FIG. 4 shows local oscillator (LO) waveforms according to an example.

FIG. 4 shows (idealized) LO waveforms for the LO signal components associated with the signal processing paths 50a-d and 60a-d according to an elucidating example. The LO signal components associated with the signal processing paths 50a, 50b, 50c, and 50d in the I signal processing path group 50 are labeled LO_Ia, LO_Ib, LO_Ic, and LO_Id, respectively, in FIG. 4. Similarly, The LO signal components associated with the signal processing paths 60a, 60b, 60c, and 60d in the Q signal processing path group 60 are labeled LO_Qa, LO_Qb, LO_Qc, and LO_Qd, respectively, in FIG. 4.

Some embodiments concerning fully differential mixer units (such as but not limited to fully differential quadrature mixer units) may be such that, for each signal processing path group, the LO signal component associated with the first signal processing path of the signal processing path group and the LO signal component associated with the fourth signal processing path of the signal processing path group are both generated equal to a first LO signal component associated with the signal processing path group. This property is illustrated in FIG. 4, wherein the LO signal component LO_Ia associated with the first signal processing path 50a of the I signal processing path group 50 and the LO signal component LO_Id associated with the fourth signal processing path 50d of the I signal processing path group 50 are both generated equal to an LO signal component LO_I associated with the I signal processing path group, and wherein the LO signal component LO_Qa associated with the first signal processing path 60a of the Q signal processing path group 60 and the LO signal component LO_Qd associated with the fourth signal processing path 60d of the Q signal processing path group 60 are both generated equal to an LO signal component LO_Q associated with the Q signal processing path group 60. Furthermore, some of these embodiments may be such that, for each signal processing path group the LO signal component associated with the second signal processing path of the signal processing path group and the LO signal component associated with the third signal processing path of the signal processing path group are both generated equal to a second LO signal component associated with the signal processing path group. This property is also illustrated in FIG. 4, wherein the LO signal component LO_Ib associated with the second signal processing path 50b of the I signal processing path group 50 and the LO signal component LO_Ic associated with the third signal processing path 50c of the I signal processing path group 50 are both generated equal to an LO signal component LO_I associated with the I signal processing path group, and wherein the LO signal component LO_Qb associated with the second signal processing path 60b of the Q signal processing path group 60 and the LO signal component LO_Qc associated with the third signal processing path 60c of the Q signal processing path group 60 are both generated equal to an LO signal component LO_Q associated with the Q signal processing path group 60. The first and the second LO signal component associated with the signal processing path group can be seen as together forming a differential LO signal component of the signal processing path group. For example, LO_I and $\overline{LO\_I}$ may be seen as together forming a differential LO signal component of the I signal processing path 50, and LO_Q and $\overline{LO\_Q}$ may be seen as together forming a differential LO signal component of the Q signal processing path group 60. The bar in $\overline{LO\_I}$ and $\overline{LO\_Q}$ does not necessarily mean that these signals are the exact inverses of LO_I and LO_Q, respectively. Instead, as used in this specification, it is part of the signal notation used for distinguishing the two single-ended LO signal components (such as LO_I and $\overline{LO\_I}$, or LO_Q and $\overline{LO\_Q}$) of a differential LO signal component. In some embodiments, there may be an approximately 180 degrees phase shift between two such single ended LO signal components of a differential LO signal component (e.g. as in FIG. 4, where there is a 180 degrees phase shift between LO_I and $\overline{LO\_I}$, and a 180 degrees phase shift between LO_Q and $\overline{LO\_Q}$).

In some embodiments where the mixer unit 30 is a fully differential mixer unit, the mixer unit 30 comprises a single differential output terminal pair. In other embodiments where the mixer unit 30 is a fully differential mixer unit, such as the fully differential quadrature mixer unit considered as an elucidating example in this specification, the mixer unit 30 comprises a plurality of differential output terminal pairs. Consequently, in these embodiments, the output signal comprises a plurality of differential output signal pairs, and there is a plurality of associated signal processing path groups. In some of these embodiments, there is a mutual phase shift between the differential LO signal components associated with the different signal processing path groups. In some embodiments, where the mixer unit 30 is a fully differential quadrature mixer unit, the differential LO signal components of the I and Q signal processing paths 50, 60 are generated in quadrature as illustrated in FIG. 4. For differential LO signal components generated in quadrature, there is essentially a 90 degree phase shift between the differential LO signal component of the I signal processing path group 50 and the differential LO signal component of the Q signal processing path group 60 (ideally, the phase shift is exactly 90 degrees, but e.g. due to noise and manufacturing inaccuracies, this is not achievable in practice).

Figure 5:
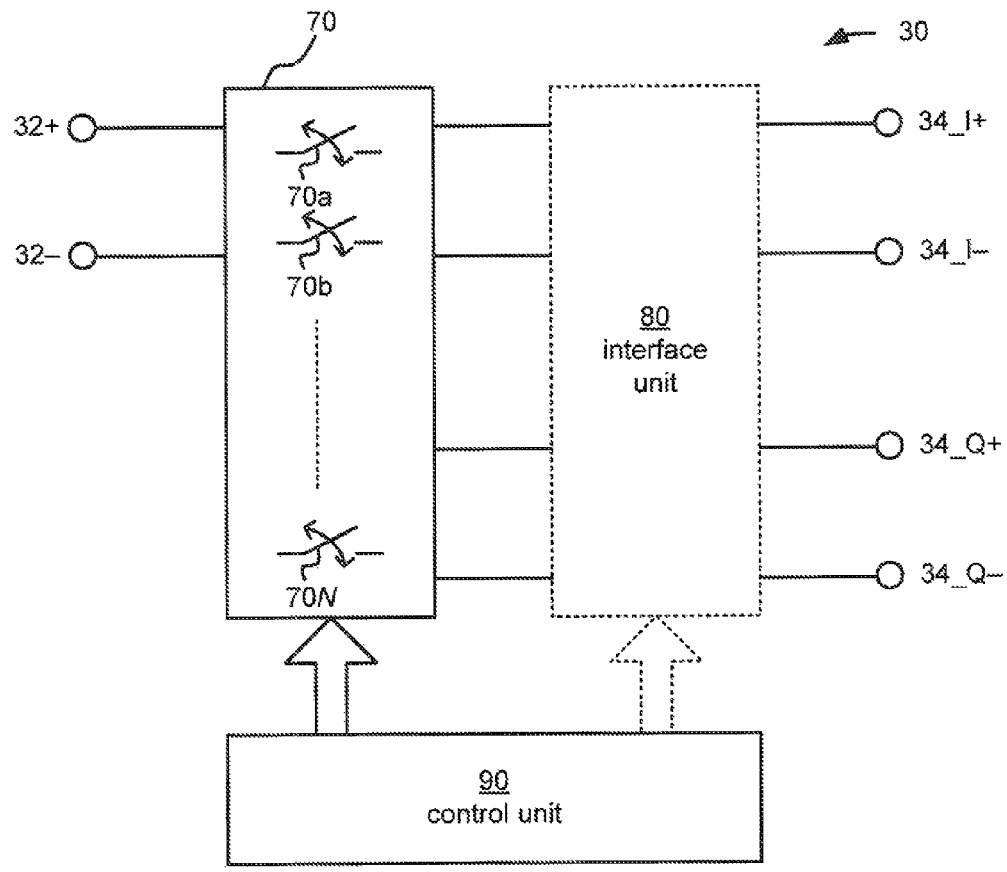
FIG. 5 is a simplified block diagram of a mixer unit according to some embodiments of the present invention.

FIG. 5 is a simplified block diagram of the mixer unit 30 according to some embodiments of the present invention. In FIG. 5, the mixer unit 30 comprises a switch unit 70 comprising a plurality of mixer switches 70a-N. The following convention is used in this specification in relation to the reference signs for the mixer switches. Non capital letters in non italic font (such as a and b in 70a and 70b) is used for identifying specific individual mixer switches. Capital letters in italic font is used as a parameter or variable that corresponds to, or adopts, a certain "value" (i.e. a, b, c, d, . . . ) depending on circumstances explained in connection with the corresponding figure. For example, the reference sign 70N refers to the last mixer switch of the plurality of mixer switches 70a-N, and the "value" of N thus depends on how many mixer switches 70a-N there are.

In FIG. 5, the mixer unit 30 comprises an optional interface unit 80 described further in the context of specific embodiments. The interface unit 80 may be arranged to connect one or more mixer switches 70a-N to the appropriate signal processing path depending on a current configuration of the mixer unit 30. In particular, such an interface unit may be employed in embodiments making use of phase scrambling, where a particular mixer switch 70a-N may be used in different signal processing paths (at different instants in time). In some embodiments, wherein each mixer switch 70a-N (when operated) is always operated in the same signal processing path, the interface unit 80 may be omitted, and e.g. be replaced with hardwiring of the mixer switches to the appropriate output terminals of the mixer unit 30.

As illustrated in FIG. 5, embodiments of the mixer unit 30 comprises a control unit 90. The control unit 90 is adapted to, for each signal processing path (e.g. 50a-d, 60a-d), dynamically select an associated subset, in the following denoted active switch subset, of the plurality of mixer switches 70a-N for operation in the signal processing path (e.g. 50a-d, 60a-d). The selection is performed by the control unit 90 such that which of the plurality of mixer switches 70a-N belong to said active switch subset (i.e. is operated in the particular signal processing path) varies in time. Furthermore, at any instant in time, the union of all the active switch subsets (i.e. all switches currently selected by the control unit 90 for operation in any of the signal processing paths) is a strict subset, in the following denoted combined active subset, of the plurality of mixer switches 70a-N. That is, there is a redundancy in that there is always one or more (depending on embodiment) mixer switches 70a-N that are not used. Embodiments of the mixer unit 30 are described herein during operation. Hence, the expression "at any time", when used herein, should be interpreted as "at any time during operation of the mixer unit 30", it does not include instants in time when a radio communication apparatus comprising the mixer unit 30 is powered off, or the mixer unit 30 for some other reason is not operated to perform frequency translation. Furthermore, the control unit 90 is adapted to activate only the mixer switches 70a-N in the combined active subset (i.e. only the mixer switches selected for operation in one of the signal processing paths) by, for each mixer switch 70a-N in the combined active subset, supplying the LO signal component (e.g. LO_Ia-d, LO_Qa-d) associated with the signal processing path (e.g. 50a-d, 60a-d) to which that mixer switch 70a-N (currently) belongs (i.e., the signal processing path it is currently selected by the control unit 90 to operate in). The above mentioned redundancy, together with the dynamic selection of mixer switches for operation in the different signal processing paths, facilitates the use of relatively small mixer switches 70a-N which in turn facilitates a relatively low power consumption for driving the mixer switches 70a-N, as discussed in the beginning of this detailed description. For a given design (e.g. type of transistor, size of the transistor, etc) of the mixer switches 70a-N, the lowest power consumption for driving the mixer switches is obtained when each active switch subset at any instant in time consists of exactly one mixer switch 70a-N.

Figure 6:
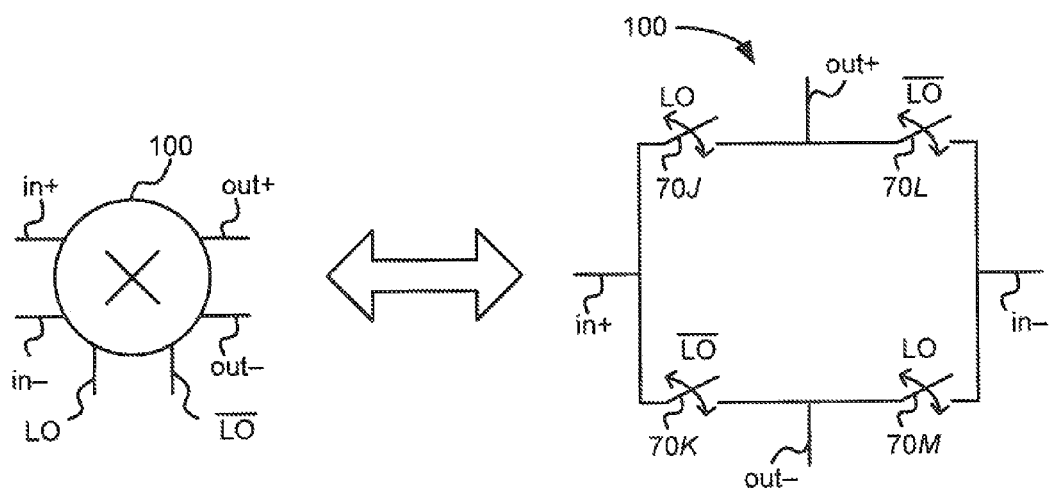
FIG. 6 shows a symbol and a simplified schematic circuit diagram of a double balance passive mixer.

Simplified control of the mixer unit 30, due to a reduced degree of freedom, may be obtained by grouping mixer switches 70a-N together into groups, wherein the mixer switches of such a group are always activated simultaneously. An example of this, where the group of mixer switches is a double-balance passive mixer 100, is illustrated in FIG. 6. A symbolic view of the double balanced passive mixer 100 is shown to the left in FIG. 6. As can bee seen from FIG. 6, the double balanced passive mixer 100 has two input terminals, in+ and in−, and two output terminals, out+ and out−. Furthermore, the double balanced passive mixer has two LO terminals, one for receiving an LO signal component LO, and another one for receiving an LO signal component $\overline{LO}$, wherein LO and $\overline{LO}$ together forms a differential LO signal component, as described above in relation to LO_I and $\overline{LO\_I}$, and to LO_Q and $\overline{LO\_Q}$. For example, with reference also to FIG. 4, the LO signal components LO and $\overline{LO}$ (FIG. 6) may be the LO signal components LO_I and $\overline{LO\_I}$ (FIG. 4), respectively. Alternatively, the LO signal components LO and $\overline{LO}$ (FIG. 6) may be the LO signal components LO_Q and $\overline{LO\_Q}$ (FIG. 4), respectively. A schematic circuit diagram of the double balanced passive mixer 100 is shown to the right in FIG. 6. The double balanced passive mixer 100 comprises a first mixer switch 70J, connected in the signal path between the input terminal in+ and the output terminal out+, which is controlled by the LO signal component LO. Furthermore, the double balanced passive mixer 100 comprises a second mixer switch 70K, connected in the signal path between the input terminal in+ and the output terminal out−, which is controlled by the LO signal component $\overline{LO}$. Moreover, the double balanced passive mixer 100 comprises a third mixer switch 70L, connected in the signal path between the input terminal in− and the output terminal out−, which is controlled by the LO signal component $\overline{LO}$. In addition thereto, the double balanced passive mixer 100 comprises a fourth mixer switch 70M, connected in the signal path between the input terminal in− and the output terminal out−, which is controlled by the LO signal component LO. The parameters J, K, L, and M in the reference signs 70J-M in FIG. 6 are used to indicate four distinct mixer switches of the plurality of mixer switches 70a-N that are unique for a particular double balanced passive mixer 100 (i.e. not part of any other double balanced passive mixer of the mixer unit 30).

Thus, according to some embodiments of the mixer unit 30, at least some of the mixer switches 70a-N are grouped into such double balanced passive mixers 100. In such embodiments, the control unit 90 is adapted to dynamically select the active switch subsets such that, for each such double balanced passive mixer 100, each mixer switch 70J-M of that double balanced passive mixer 100 belongs to the combined active subset if and only if the other mixer switches 70J-M of that double balanced passive mixer 100 also belongs to the combined active subset, and all mixer switches 70J-M of the double balanced mixer 100 are then operated in signal processing paths (e.g. 50a-d, 60a-d) of a signal processing path group (e.g. 50, 60) that is common to the mixer switches 70J-M of the double balanced passive mixer 100. In other words, the mixer switches 70J-M of a double balance passive mixer 100 are either all "idle" (or "not currently operated") or are all currently operated (or "activated"), and in the latter case in a common signal processing path group, depending on the current selection of the control unit 30. Such embodiments are described below with reference to FIGS. 7-12.

Figure 7:
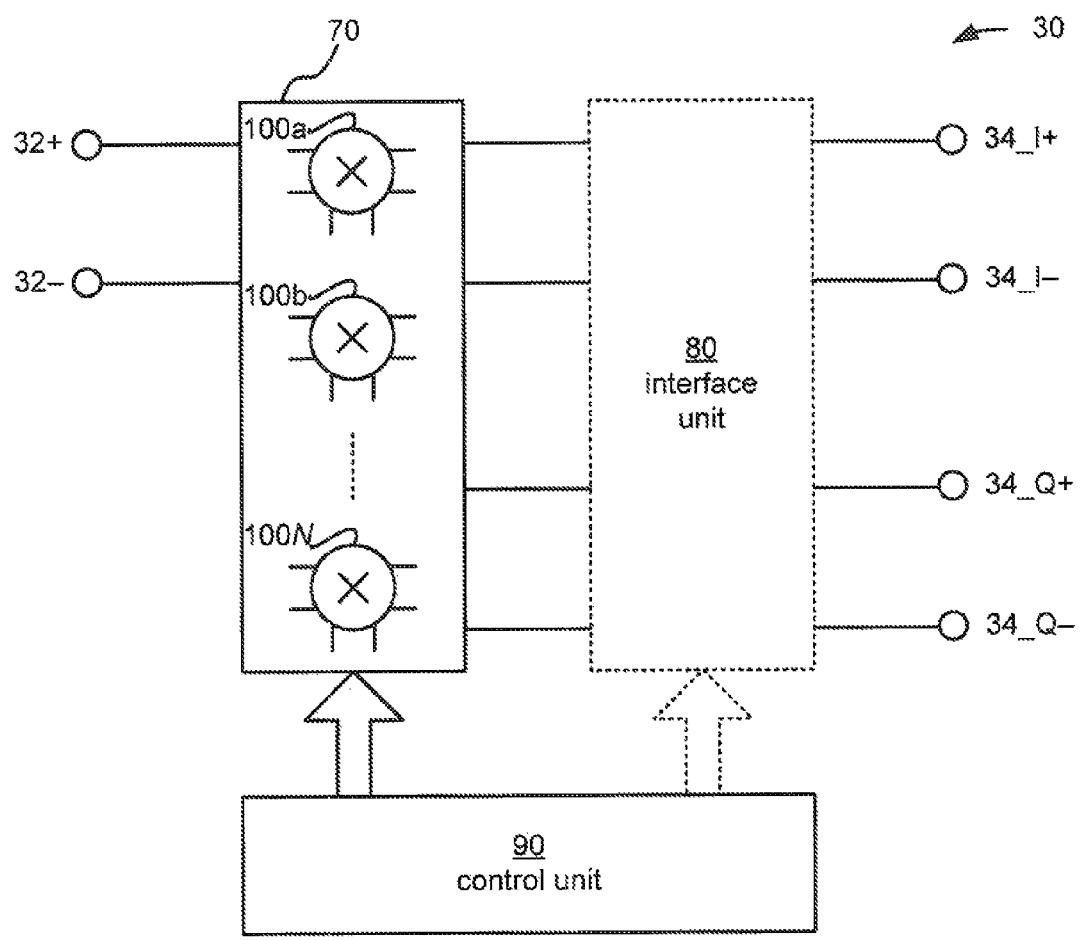
FIGS. 7-11 show simplified block diagrams of mixer units according some embodiments of the present invention.

A general depiction of embodiments of the mixer unit 30, wherein the mixer switches 70a-N are grouped into a plurality of double balanced passive mixers 100a-N, is provided in FIG. 7, wherein the switch unit 70 is shown to comprise said plurality of double balanced passive mixers 100a-N. In FIG. 7, the parameter N in the reference sign 100N is used to indicate the last double balanced passive mixer of the switch unit 70 (and is thus not the same N as in the reference sign 70N in FIG. 5).

Some embodiments of the mixer unit 30 are such that, for each double balanced passive mixer 100a-N, said signal processing path group common to the mixer switches 70J-M of the double-balanced passive mixer 100a-N is the same each time the control unit 90 selects the mixer switches 70J-M of the double balanced passive mixer 100a-N for inclusion in the combined active subset. Examples of such embodiments are described below with reference to FIGS. 8 and 9.

Figure 8:
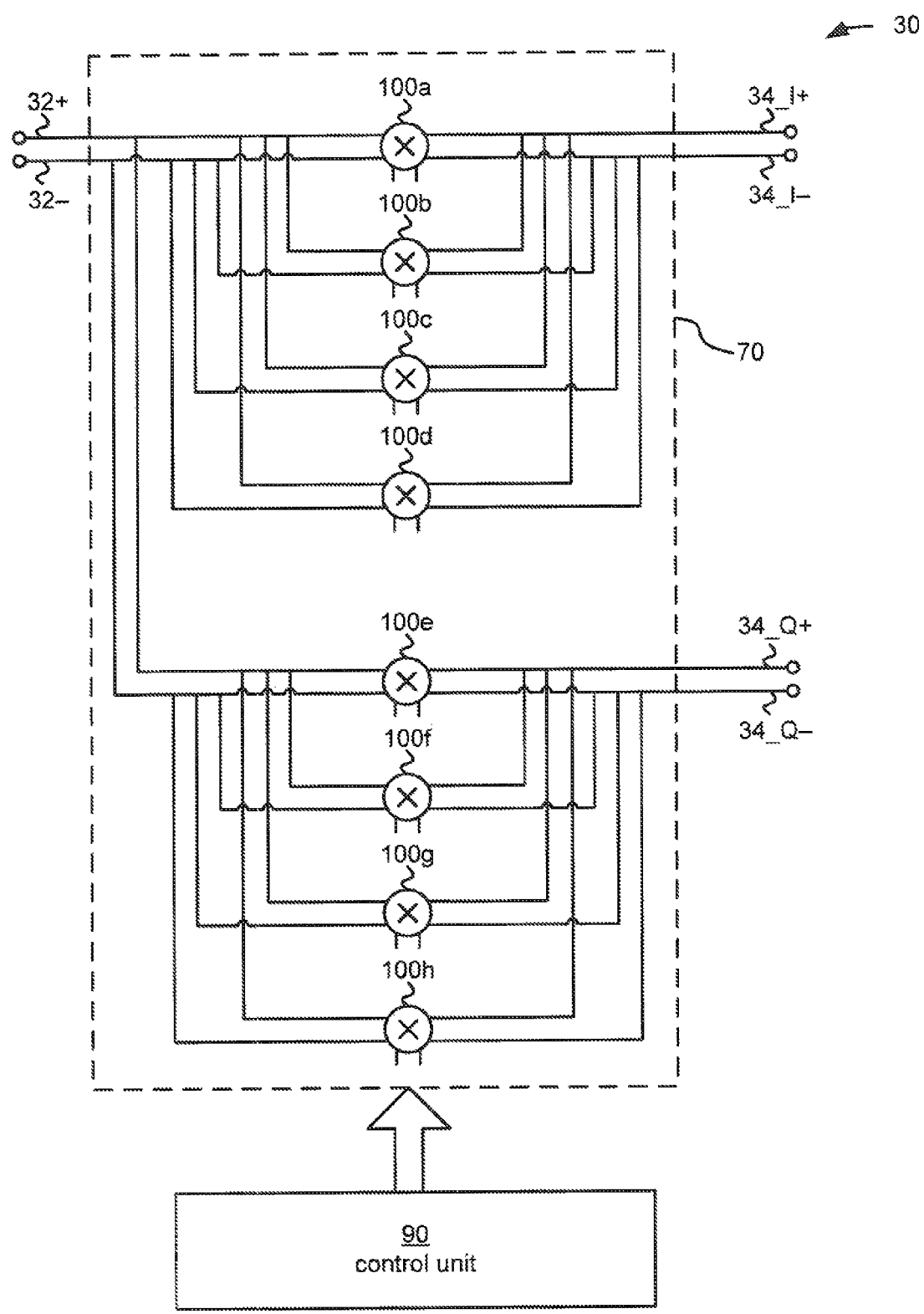

In the example embodiment illustrated in FIG. 8, there are four double balanced passive mixers 100a-d in the switch unit 70 that can be dynamically selected by the control unit 90 for operation in the I signal processing path group 50 (FIG. 3). The number four is naturally only any example, other numbers of double balanced passive mixers may be used in other embodiments. Similarly, in the example embodiment illustrated in FIG. 8, there are four double balanced passive mixers 100e-h in the switch unit 70 that can be dynamically selected by the control unit 90 for operation in the Q signal processing path group 60 (FIG. 3). Again, the number four is naturally only any example, other numbers of double balanced passive mixers may be used in other embodiments. In the example embodiment illustrated in FIG. 8, each double balanced mixer 100a-h has a first input terminal connected to the input terminal 32+ of the mixer unit 30 and a second input terminal connected to the input terminal 32+ of the mixer unit 30. Furthermore, in the example embodiment illustrated in FIG. 8, each mixer switch of each double balanced passive mixer 100a-h (when selected for operation by the control unit 90) is always operated in the same signal processing path. Thus, the embodiment illustrated in FIG. 8 is an example of embodiments of the mixer unit 30 wherein, for each mixer switch 70a-N, every time that mixer switch 70a-N belongs to the combined active subset (i.e. every time that mixer switch 70a-N is selected by the control unit 90 for operation), that mixer switch is always operated in the same one of the signal processing paths 50a-d, 60a-d. An advantage of such embodiments is that the interface unit 80 (FIGS. 5 and 7) can be omitted and the mixer switches 70a-N can instead be hardwired to the output terminals (e.g. 34_I+, 34_I−, 34_Q+, 34_Q−).

Figure 9:
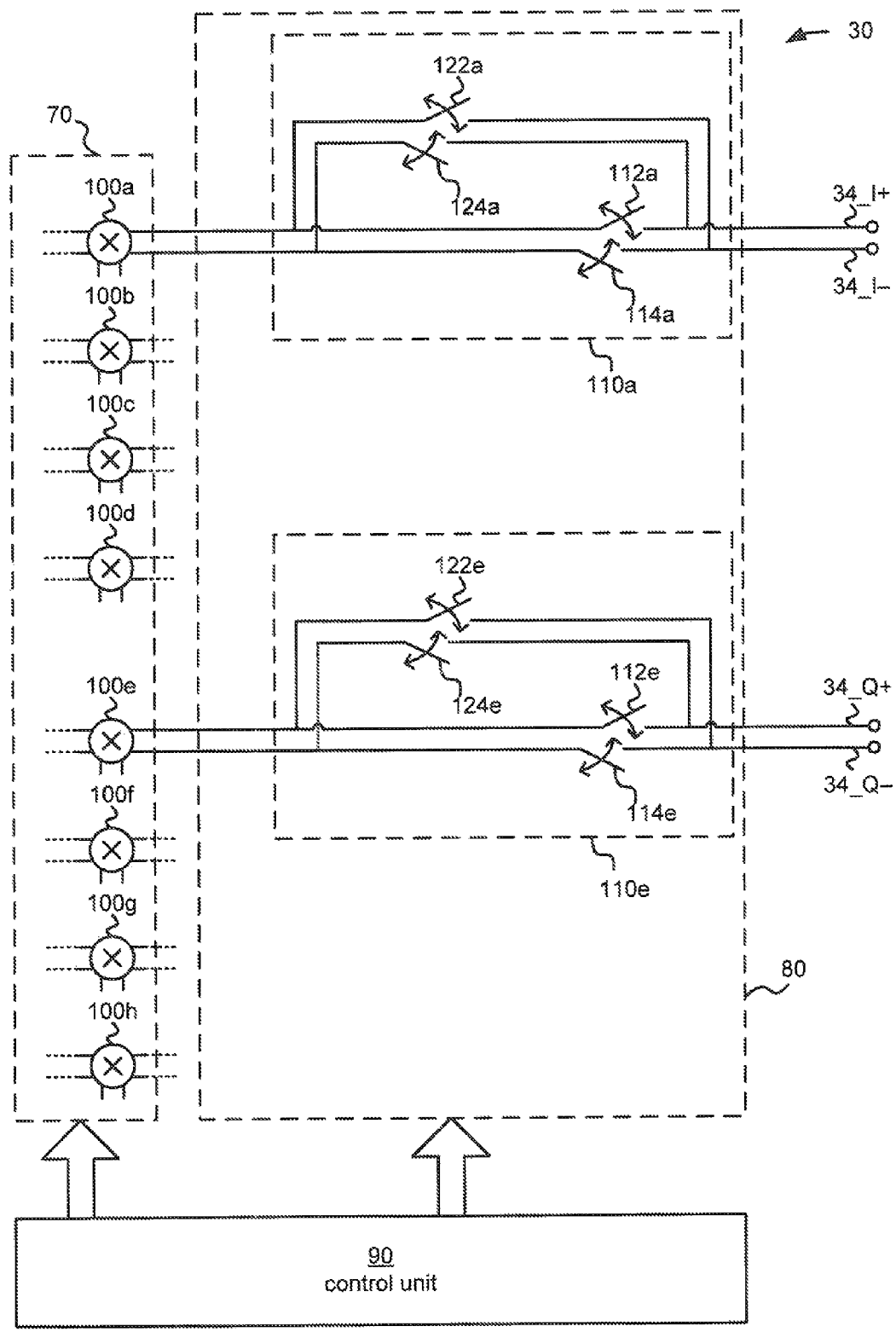

Also in the example embodiment illustrated in FIG. 9, there are four double balanced passive mixers 100a-d in the switch unit 70 that can be dynamically selected by the control unit 90 for operation in the I signal processing path group 50 (FIG. 3). Once again, the number four is naturally only any example, other numbers of double balanced passive mixers may be used in other embodiments. Similarly, in the example embodiment illustrated in FIG. 9, there are also four double balanced passive mixers 100e-h in the switch unit 70 that can be dynamically selected by the control unit 90 for operation in the Q signal processing path group 60 (FIG. 3). As before, the number four is naturally only any example, other numbers of double balanced passive mixers may be used in other embodiments. The connections of the input terminals of the double balanced passive mixers 100a-h to the input terminals 32+ and 32− of the mixer unit 30 can be identical to those in FIG. 8 and have been omitted (replaced by dotted lines) in FIG. 9. A difference between the embodiments illustrated in FIGS. 9 and 8 is that the embodiment illustrated in FIG. 9 employs a version of phase scrambling. Even though each double balanced passive mixer 100a-h (when in operation) is always operated in the same signal processing path group, the signal processing path that each individual mixer switch 70a-N (when in operation) is operated in varies in time. In the example embodiment illustrated in FIG. 9, this is facilitated by a scrambler unit 110a-h included in the interface unit 80 for each double balanced passive mixer 100a-h. The scrambler unit 110a comprises a switch 112a connected in the path between a first output terminal of the double balanced passive mixer 100a and the output terminal 34_I+ of the mixer unit 30. Furthermore, the scrambler unit 110a comprises a switch 114a connected in the path between a second output terminal of the double balanced passive mixer 100a and the output terminal 34_I− of the mixer unit 30. Moreover, the scrambler unit 110a comprises a switch 122a connected in the path between the first output terminal of the double balanced passive mixer 100a and the output terminal 34_I− of the mixer unit 30. In addition, the scrambler unit 110a comprises a switch 124a connected in the path between the second output terminal of the double balanced passive mixer 100a and the output terminal 34_I+ of the mixer unit 30. In a first active mode of the double balanced passive mixer 100a (described below with reference to FIG. 12), the switches 112a and 114a are controlled by the control unit 90 to be closed, whereas the switches 122a and 124a are controlled by the control unit 90 to be open. In a second active mode of the double balanced passive mixer 100a (also described below with reference to FIG. 12), the switches 112a and 114a are controlled by the control unit 90 to be open, whereas the switches 122a and 124a are controlled by the control unit 90 to be closed, whereby a switch of polarity is obtained compared with the first active mode. Scrambler units 110b, c, and d (not shown in FIG. 9 for simplicity), identical in constitution to the scrambler unit 110a, are connected between the first and second output terminals of the double balanced passive mixers 100b, c, and d, respectively, and the output terminals 34_I+ and 34_I− of the mixer unit 30. These are controlled by the control unit 90 in the same way as the scrambler unit 110a (but, of course, depending on the active mode (first or second) of the double balanced passive mixer to which it is connected rather than the active mode of the double balanced passive mixer 100a).

Similarly, the scrambler unit 110e comprises a switch 112e connected in the path between a first output terminal of the double balanced passive mixer 100e and the output terminal 34_Q+ of the mixer unit 30. Furthermore, the scrambler unit 110e comprises a switch 114e connected in the path between a second output terminal of the double balanced passive mixer 100a and the output terminal 34_Q− of the mixer unit 30. Moreover, the scrambler unit 110e comprises a switch 122e connected in the path between the first output terminal of the double balanced passive mixer 100e and the output terminal 34_Q− of the mixer unit 30. In addition, the scrambler unit 110e comprises a switch 124e connected in the path between the second output terminal of the double balanced passive mixer 100e and the output terminal 34_Q+ of the mixer unit 30. In the first active mode of the double balanced passive mixer 100e, the switches 112e and 114e are controlled by the control unit 90 to be closed, whereas the switches 122e and 124e are controlled by the control unit 90 to be open. In the second active mode of the double balanced passive mixer 100e, the switches 112e and 114e are controlled by the control unit 90 to be open, whereas the switches 122e and 124e are controlled by the control unit 90 to be closed, whereby a change of polarity is obtained compared with the first active mode. Scrambler units 110f, g, and h (not shown in FIG. 9 for simplicity), identical in constitution to the scrambler unit 110e, are connected between the first and second output terminals of the double balanced passive mixers 100f, g, and h, respectively, and the output terminals 34_Q+ and 34_Q− of the mixer unit 30. These are controlled by the control unit 90 in the same way as the scrambler unit 110e (but, of course, depending on the active mode (first or second) of the double balanced passive mixer to which it is connected rather than the active mode of the double balanced passive mixer 100e).

The control unit 90 may be adapted to dynamically select which active mode of the first and the second active mode each double balanced passive mixer 100a-N is set to operate in when the mixer switches 70J-M of the double balanced passive mixer 100a-N are selected by the control unit 90 for inclusion in the combined active subset such that the active mode varies in time.

Some embodiments of the mixer unit 30 are such that, for each double balanced passive mixer, said signal processing path group common to the mixer switches 70J-M of the double-balanced passive mixer 100a-N varies in time. Examples of such embodiments are described below with reference to FIGS. 10 and 11.

Figure 10:
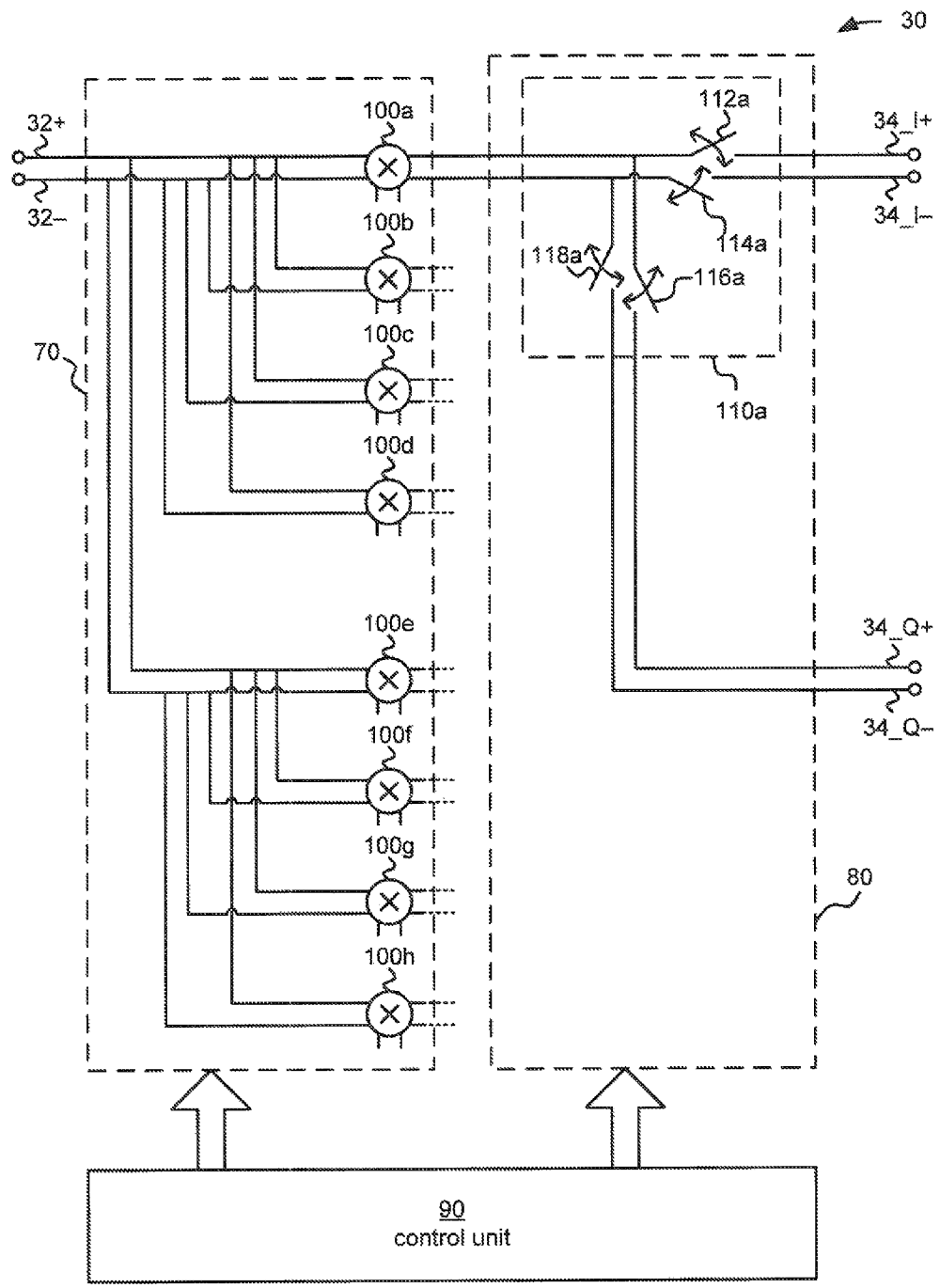

In the example embodiment illustrated in FIG. 10, there are eight double balanced passive mixers 100a-h in the switch unit 70 that can be dynamically selected by the control unit 90 for operation in the I signal processing path group 50 or in the Q signal processing path group 60 (FIG. 3). The number eight is naturally only any example, other numbers of double balanced passive mixers may be used in other embodiments. In the example embodiment illustrated in FIG. 8, each double balanced mixer 100a-h has a first input terminal connected to the input terminal 32+ of the mixer unit 30 and a second input terminal connected to the input terminal 32− of the mixer unit 30. In similarity with the embodiment illustrated in FIG. 9, the interface unit 80 comprises a scrambler unit 110a-h for each double balanced passive mixer 100a-h. However, these scrambler units 110a-h are different from those of the embodiment illustrated in FIG. 9, whereby another type of phase scrambling is obtainable. In similarity with the embodiment illustrated in FIG. 9, the scrambler unit 110a comprises the switch 112a connected in the path between the first output terminal of the double balanced passive mixer 100a and the output terminal 34_I+ of the mixer unit 30, and the switch 114a connected in the path between the second output terminal of the double balanced passive mixer 100a and the output terminal 34_I− of the mixer unit 30. In addition, the scrambler unit 110a comprises a switch 116a connected in the path between the first output terminal of the double balanced passive mixer 100a and the output terminal 34_Q+ of the mixer unit 30, and a switch 118a connected in the path between the second output terminal of the double balanced passive mixer 100a and the output terminal 34_Q− of the mixer unit 30. One of two operational conditions are applicable for the double balanced passive mixer 100a and the scrambler unit 110a. According to a first condition, the double balanced passive mixer 100 (when in operation) is driven by the differential LO signal component of the I signal processing path group 50 (i.e. the differential LO signal component formed by the LO signals components LO_I and $\overline{LO\_I}$ in FIG. 4). According to a second condition, the double balanced passive mixer 100 (when in operation) is driven by the differential LO signal component of the Q signal processing path group 50 (i.e. the differential LO signal component formed by the LO signals components LO_Q and $\overline{LO\_Q}$ in FIG. 4). Under the first condition, the switches 112a and 114a are controlled by the control unit 90 to be closed, whereas the switches 116a and 118a are controlled by the control unit 90 to be open. Under the second condition, the switches 112a and 114a are controlled by the control unit 90 to be open, whereas the switches 116a and 118a are controlled by the control unit 90 to be closed. The control unit 90 may be configured to dynamically select the operational condition (first or second) such that the operational condition varies in time.

Scrambler units 110b, c, d, e, f, g, and h (not shown in FIG. 10 for simplicity), identical in constitution to the scrambler unit 110a, are connected between the first and second output terminals of the double balanced passive mixers 100b, c, d, e, f, g, and h, respectively, and the output terminals 34_I+, 34_I—, 34_Q+, and 34_Q− of the mixer unit 30. These are controlled, together with the double balanced passive mixer 100b-h to which it is connected, by the control unit 90 in the same way as the scrambler unit 110a and the mixer unit 100a.

Figure 11:
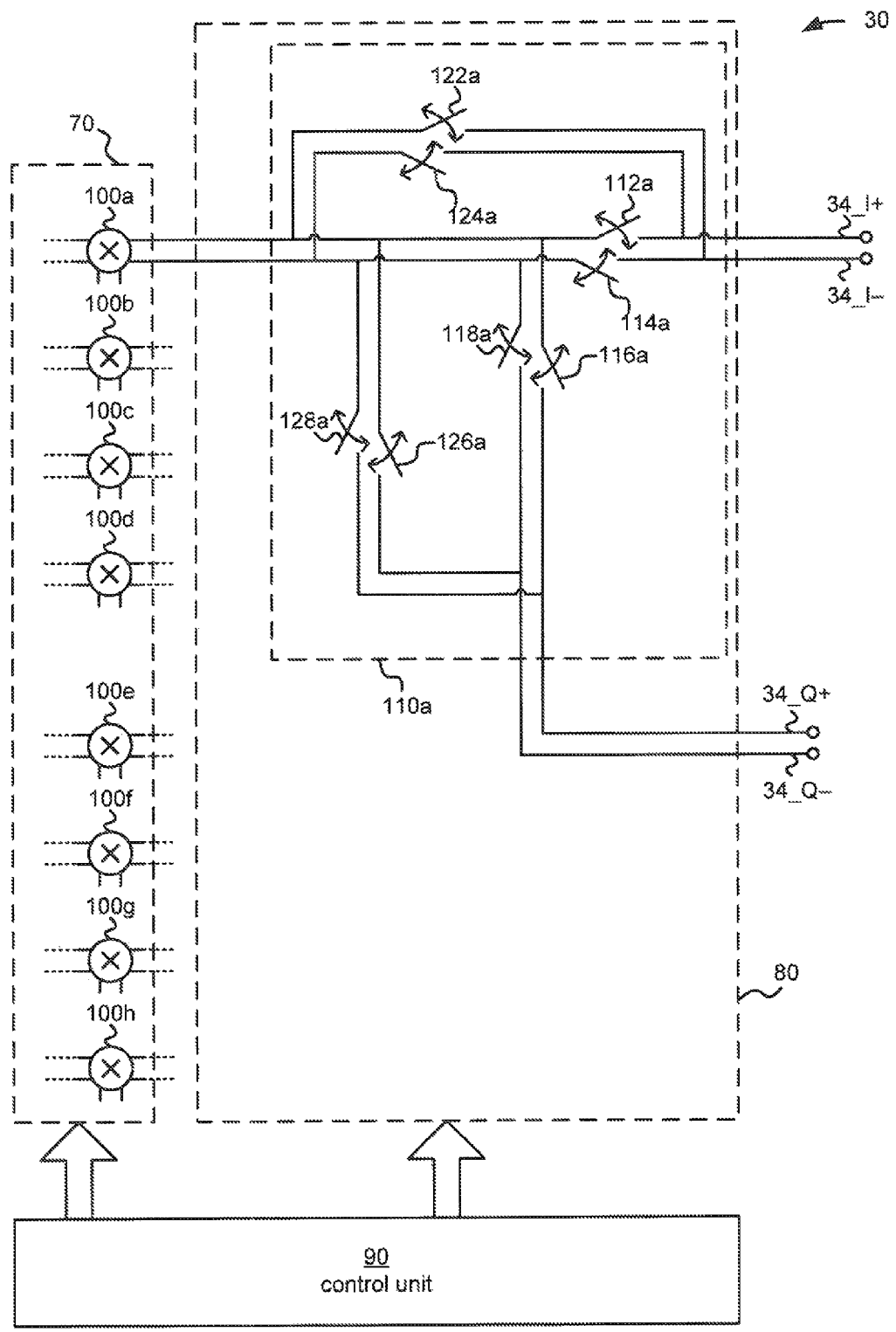

Also in the example embodiment illustrated in FIG. 11, there are eight double balanced passive mixers 100a-h in the switch unit 70 that can be dynamically selected by the control unit 90 for operation in the I signal processing path group 50 or in the Q signal processing path group 60 (FIG. 3). Again, the number eight is naturally only any example, other numbers of double balanced passive mixers may be used in other embodiments. The connections of the input terminals of the double balanced passive mixers 100a-h to the input terminals 32+ and 32− of the mixer unit 30 can be identical to those in FIG. 10 and have been omitted (replaced by dotted lines) in FIG. 11. In similarity with the embodiments illustrated in FIGS. 9-10, the interface unit 80 comprises a scrambler unit 110a-h for each double balanced passive mixer 100a-h. However, these scrambler units 110a-h are different from those of the embodiments illustrated in FIGS. 9-10, whereby yet another type of phase scrambling is obtainable, which can be seen as a combination of the phase scramblings obtainable by the embodiments illustrated in FIGS. 9 and 10. In similarity with the embodiment illustrated in FIG. 10, the scrambler unit 110a comprises the switch 112a connected in the path between the first output terminal of the double balanced passive mixer 100a and the output terminal 34_I+ of the mixer unit 30, the switch 114a connected in the path between the second output terminal of the double balanced passive mixer 100a and the output terminal 34_I− of the mixer unit 30, the switch 116a connected in the path between the first output terminal of the double balanced passive mixer 100a and the output terminal 34_Q+ of the mixer unit 30, and the switch 118a connected in the path between the second output terminal of the double balanced passive mixer 100a and the output terminal 34_Q− of the mixer unit 30. Furthermore, similarly to the embodiment illustrated in FIG. 9, the scrambler unit 110a comprises the switch 122a connected in the path between the first output terminal of the double balanced passive mixer 100a and the output terminal 34_I− of the mixer unit 30, and the switch 124a connected in the path between the second output terminal of the double balanced passive mixer 100a and the output terminal 34_I+ of the mixer unit 30. Moreover, the scrambler unit 110a comprises a switch 126a connected in the path between the first output terminal of the double balanced passive mixer 100a and the output terminal 34_Q− of the mixer unit 30, and a switch 128a connected in the path between the second output terminal of the double balanced passive mixer 100a and the output terminal 34_Q+ of the mixer unit 30.

One of four operational conditions are applicable for the double balanced passive mixer 100a and the scrambler unit 110a. According to a first condition, the double balanced passive mixer 100 (when in operation) is controlled by the control unit 90 to operate in the first active mode (described below with reference to FIG. 12) and driven by the differential LO signal component of the I signal processing path group 50 (i.e. the differential LO signal component formed by the LO signals components LO_I and $\overline{LO\_I}$ in FIG. 4). According to a second condition, the double balanced passive mixer 100 (when in operation) is controlled by the control unit 90 to operate in the first active mode and driven by the differential LO signal component of the Q signal processing path group 50 (i.e. the differential LO signal component formed by the LO signals components LO_Q and $\overline{LO\_Q}$ in FIG. 4). According to a third condition, the double balanced passive mixer 100 (when in operation) is controlled by the control unit 90 to operate in the second active mode (described below with reference to FIG. 12) and driven by the differential LO signal component of the I signal processing path group 50 (i.e. the differential LO signal component formed by the LO signals components LO_I and $\overline{LO\_I}$ in FIG. 4). According to a fourth condition, the double balanced passive mixer 100 (when in operation) is controlled by the control unit 90 to operate in the second active mode and driven by the differential LO signal component of the Q signal processing path group 50 (i.e. the differential LO signal component formed by the LO signals components LO_Q and $\overline{LO\_Q}$ in FIG. 4).

Under the first condition, the switches 112a and 114a are controlled by the control unit 90 to be closed, whereas the switches 116a, 118a, 122a, 124a, 126a, and 128a are controlled by the control unit 90 to be open. Under the second condition, the switches 112a, 114a, 122a, 124a, 126a, and 128a are controlled by the control unit 90 to be open, whereas the switches 116a and 118a are controlled by the control unit 90 to be closed. Under the third condition, the switches 122a and 124a are controlled by the control unit 90 to be closed, whereas the switches 112a, 114a, 116a, 118a, 126a, and 128a are controlled by the control unit 90 to be open. Under the fourth condition, the switches 112a, 114a, 116a, 118a, 122a, and 124a are controlled by the control unit 90 to be open, whereas the switches 126a and 128a are controlled by the control unit 90 to be closed. The control unit 90 may be configured to dynamically select the operational condition (first, second, third, or fourth) such that the operational condition varies in time.

Scrambler units 110b, c, d, e, f, g, and h (not shown in FIG. 11 for simplicity), identical in constitution to the scrambler unit 110a, are connected between the first and second output terminals of the double balanced passive mixers 100b, c, d, e, f, g, and h, respectively, and the output terminals 34_I+, 34_I−, 34_Q+, and 34_Q− of the mixer unit 30. These are controlled, together with the double balanced passive mixer 100b-h to which it is connected, by the control unit 90 in the same way as the scrambler unit 110a and the mixer unit 100a.

It should be noted that, in the embodiments illustrated in FIGS. 9-11 (and similar embodiments including an interface unit 80 comprising switches for selectably connecting mixer switches 70a-N to different output terminals of the mixer unit 30), the states (open/closed) of the switches in the interface unit 80 may be advantageously altered when the mixer switch or mixer switches 70a-N to which such a switch is connected is/are idle (i.e. not currently driven by an LO signal component), whereby interference due to such state altering can be kept relatively low.

Figure 12:
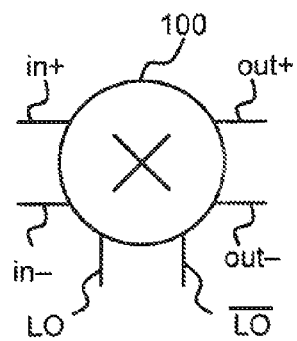
FIG. 12 illustrates a first and a second active mode of a double balanced passive mixer according to an embodiment of the present invention.
Figure 12:
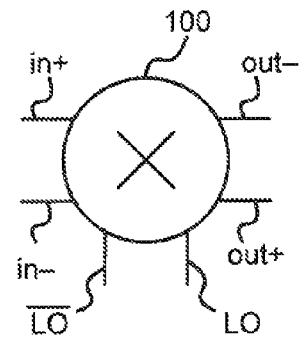

FIG. 12 illustrates the aforementioned first and second active modes of a double balanced passive mixer 100 (which may e.g. be any of the double balanced passive mixers 110a-h (FIGS. 9-12)). In FIG. 12, LO and $\overline{LO}$ could either be LO_I and $\overline{LO\_I}$, or LO_Q and $\overline{LO\_Q}$ depending on which differential LO signal component is currently used for driving the double balanced passive mixer 100. In the first active mode (illustrated to the left), the double balanced passive mixer is driven as in FIG. 6. However, in the second active mode, the roles of the LO terminals of the double balanced passive mixer 100 are interchanged in that the terminal that is arranged to receive the LO signal component LO in the first active mode is instead arranged to receive the LO signal component $\overline{LO}$ in the second active mode, and vice versa. Referring to FIG. 6, this effectively means that the roles of the mixer switches 70J and 70K are interchanged. Similarly, the roles of the mixer switches 70L and 70M are interchanged. This in turn means that the roles of the output terminals out+ and out− are interchanged, which is illustrated in FIG. 12 as well, i.e. there is a change in output polarity of the double balanced passive mixer 100. Referring to the embodiment illustrated in FIG. 9, it is to compensate for this change of output polarity that the switches 122a and 124a are closed instead of the switches 112a and 114a when the double balanced passive mixer 100a is operated in the second active mode. Similarly, referring to the embodiment illustrated in FIG. 11, it is to compensate for this change of output polarity that the switches 122a and 124a (second operational condition) or the switches 126a and 128a (fourth operational condition) are closed instead of the switches 112a, 114a, 116a, and 18a during operation in the second or fourth operational conditions. The change from one active mode to the other can be effectuated by the control unit 90 by altering what LO signal components are supplied to what switches of the double balanced passive mixer.

The first active mode of each double balanced passive mixer 110a-N can be described as follows:

A first mixer switch (e.g. 70J) of the double balanced passive mixer 100a-N is operated in the first signal processing path (e.g. 50a, 60a) of the signal processing path group common to the mixer switches (e.g. 70J-M) of the double-balanced passive mixer 100a-N. A second mixer switch (e.g. 70K) of the double balanced passive mixer 100a-N is operated in the second signal processing path (e.g. 50b, 60b) of the signal processing path group common to the mixer switches (e.g. 70J-M) of the double-balanced passive mixer 100a-N. A third mixer switch (e.g. 70L) of the double balanced passive mixer 100a-N is operated in the third signal processing path (e.g. 50c, 60c) of the signal processing path group common to the mixer switches (e.g. 70J-M) of the double-balanced passive mixer 100a-N. A fourth mixer switch (e.g. 70M) of the double balanced passive mixer 100a-N is operated in the fourth signal processing path (e.g. 50d, 60d) of the signal processing path group common to the mixer switches (e.g. 70J-M) of the double-balanced passive mixer 100a-N.

Similarly, the second active mode of each double balanced passive mixer 110a-N can be described as follows:

The first mixer switch (e.g. 70J) of the double balanced passive mixer 100a-N is operated in the second signal processing path (e.g. 50b, 60b) of the signal processing path group common to the mixer switches (e.g. 70J-M) of the double-balanced passive mixer 100a-N. The second mixer switch (e.g. 70K) of the double balanced passive mixer 100a-N is operated in the first signal processing path (e.g. 50a, 60a) of the signal processing path group common to the mixer switches (e.g. 70J-M) of the double-balanced passive mixer 100a-N. The third mixer switch (e.g. 70L) of the double balanced passive mixer 100a-N is operated in the fourth signal processing path (e.g. 50d, 60d) of the signal processing path group common to the mixer switches (e.g. 70J-M) of the double-balanced passive mixer 100a-N. The fourth mixer switch (e.g. 70M) of the double balanced passive mixer 100a-N is operated in the third signal processing path (e.g. 50c, 60c) of the signal processing path group common to the mixer switches (e.g. 70J-M) of the double-balanced passive mixer 100a-N.

As indicated in the beginning of this detailed description, the dynamic selection of mixer switches 70a-N performed by the control unit 90 may follow a fixed pattern, or sequence. In order to reduce the spurious tones caused by matching errors in the mixer switches, the period of such a sequence should be relatively long (i.e. the number of consecutive samples before the sequence repeats should be relatively high). One way of achieving this in embodiments of the mixer unit 30 having more than one signal processing path 50a-d, 60a-d is to, for each of two or more such signal processing paths, dynamically select which of the mixer switches currently belong(s) to that signal processing path according to a time periodic sequence associated with the signal processing path, where the time periodic sequences associated with the two or more of the signal processing paths have mutually different periods. Hence, according to some embodiments of the present invention, the control unit 90 is adapted to perform the dynamic selection of mixer switches 70a-N in such a manner.

Figure 13:
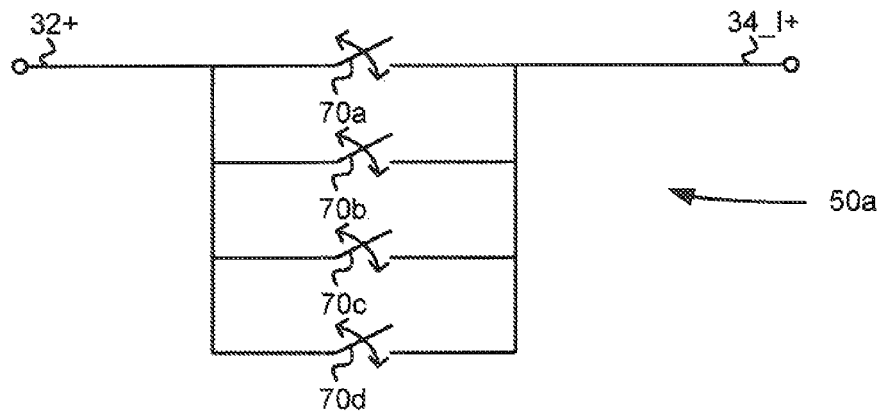
FIG. 13 schematically illustrates part of a mixer unit according to some embodiments of the present invention.
Figure 13:
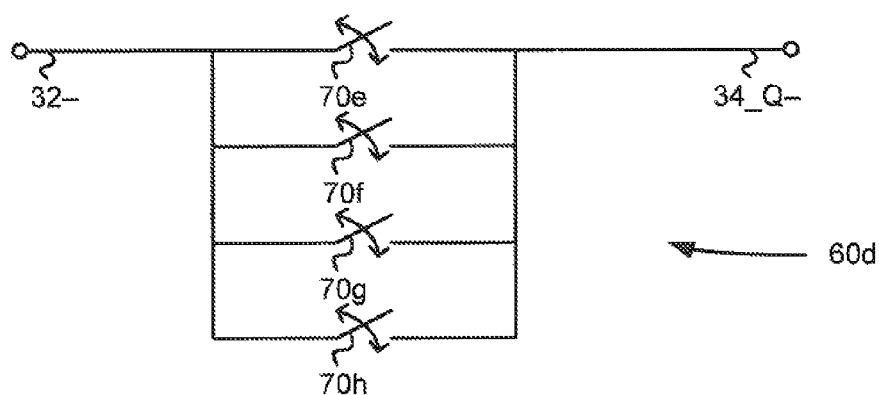

To illustrate this, FIG. 13 shows two signal processing paths, 50a and 60d, and the mixer switches 70a-d and 70e-h, respectively, that are selectable for operation in these signal processing paths according to an example embodiment. According to an example, the control unit 90 is adapted to dynamically select the mixer switch to be operated in the signal processing path 50a in the following sequence (a, b, c, and d refers to the switches 70a, 70b, 70c, and 70d, respectively):

$S_1$=[a, b, c, d, b, c, d, a, c, d, a, b, . . . ]

where the dots indicate that the sequence starts over from that point, thus the period for this sequence $S_1$ is 12 samples. Furthermore, according to the example, the control unit 90 is adapted to dynamically select the mixer switch to be operated in the signal processing path 60d in the following sequence (e, f, g, and h refers to the switches 70e, 70f, 70g, and 70h, respectively):

$S_2 = [e, f, g, h, g, h, e, f, \ldots]$ where, again, the dots indicate that the sequence starts over from that point, thus the period for this sequence $S_2$ is 8 samples. The combined sequence in which the mixer switches are dynamically selected for operation in the signal processing paths 50a and 60d can thus be expressed as follows:

$S_3 = [(a;e), (b;f), (c;g), (d;h), (b;g), (c;h), (d;e), (a;f), (c;e), (d;f), (a;g), (b;h), (a;g), (b;h), (c;e), (d;f), (b;e), (c;f), (d;g), (a;h), (c;g), (d;h), (a;e), (b;f), \ldots]$ where, again, the dots indicate that the sequence starts over from that point, thus the period for this sequence $S_3$ is 24 samples, i.e. 3 times longer than for the sequence $S_1$ and 2 times longer than for the sequence $S_2$ (which is due to that the period of $S_2$ is ⅔ of the period of $S_1$). By cleverly selecting the ratios between the different sequences for the individual signal processing paths (e.g., one should not be selected as an integer multiple of the other), relatively long combined sequences may be generated from comparably shorter sequences for the individual signal processing paths.

A suitable rate at which the active subsets are updated (e.g., for the specific examples mentioned in the previous few paragraphs, the update rate of the sequences $S_1$, $S_2$, and $S_3$) may e.g. be determined based on prototype measurements and/or computer simulations. In the following, this rate is referred to as "the dynamic selection rate", which in some embodiments may be the same for each signal processing path, and in some embodiments may be different for different signal processing paths. The dynamic selection rate may be constant in some embodiments, and may vary in time in some embodiments. In any case, it is recommended that, for each signal processing path, the associated active subset is updated when the corresponding LO signal component is in the "off state", as changing the mixer switches in the active subset during the "on state" might cause distortion. Consequently, the dynamic selection rate should at least be lower than the LO frequency. In embodiments including the interface unit 80, the dynamic selection rate may be selected based on a trade off between dynamic matching effect and power consumption; increasing the dynamic selection rate would improve the dynamic matching effect, but would on the other hand also increase the power consumption since the switches in the interface unit 80 would have to be switched more often. As a rule of thumbs, a rate of 1/10 (or thereabouts) of the LO frequency may be used as the dynamic selection rate, or as a starting point for determining a suitable dynamic selection rate. The determination of a suitable dynamic selection rate should preferably take into account the power spectral distribution of distortion resulting from matching errors. For example, dynamic selection rates that are so low that blocking signals and/or TX (transmit) leaks are downconverted into co-channel interference should normally be avoided. This can e.g. be achieved by selecting a dynamic selection rate outside an RX (receive) band of interest, preferably even somewhat larger than the duplex distance.

It can be noted above that there are various trade offs between design complexity, on the one hand, and degrees of freedom on the other hand. For example, in embodiments where each mixer switch (when in operation) is always operated in the same signal processing path, the design complexity may be comparably low, e.g. in that the interface unit 80 can be omitted, which e.g. facilitates a relatively small circuit area. On the other hand, embodiments where mixer switches may be individually selected for operation in multiple signal processing paths (at different instants in time) provides a higher degree of freedom, which can facilitate reducing the spurious tones at the mixer output. Another example of reducing the design complexity is grouping mixer switches 70a-N together into groups, wherein the control unit 90 is adapted to control the mixer switches of each such group together such that they are either all operated (or "selected for inclusion in the combined active subset") or all idle (or "not operated" or "not selected for inclusion in the combined active subset"). This was elucidated with the example of grouping mixer switches 70a-N into double balanced passive mixers 100a-N, but other groupings are also possible within the scope of the present invention, e.g. grouping mixer switches 70a-N into single balanced passive mixers.

According to some embodiments, there is provided a method of controlling the mixer unit 30. The method may e.g. be performed by the control unit 90 (i.e., the control unit 90 may be configured to perform the method).

Embodiments of the method comprises, for each signal processing path (e.g. 50a-d, 60a-d), dynamically selecting the associated subset, above (and in the following) denoted active switch subset, of the plurality of mixer switches (e.g. 70a-N) for operation in the signal processing path (e.g. 50a-d, 60a-d) such that which of the plurality of mixer switches (e.g. 70a-N) belong to said active switch subset varies in time and, at any instant in time, the union of all the active switch subsets (i.e. all switches currently selected by for operation in any of the signal processing paths) is a strict subset, above (and in the following) denoted combined active subset, of the plurality of mixer switches (e.g. 70a-N). Furthermore, embodiments of the method comprises activating only the mixer switches belonging to said combined active subset by, for each mixer switch in the active subset, supplying the LO signal component (e.g. LO_Ia-d, LO_Qa-d) associated with the signal processing path to which that mixer switch belongs.

Figure 14:
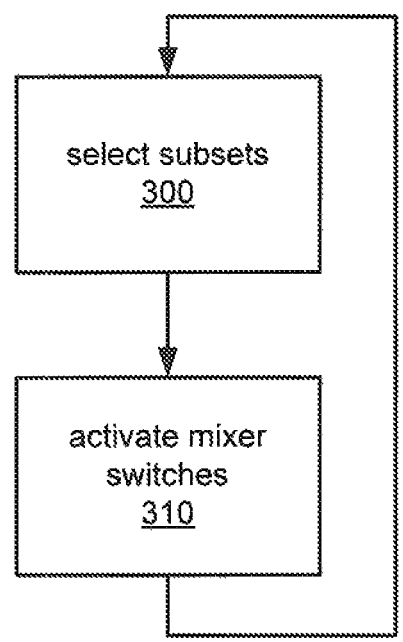
FIG. 14 is a flow chart for a method according to some embodiments of the present invention.

FIG. 14 is a flowchart illustrating embodiments of the method. In step 300, the active switch subsets for the signal processing paths are selected. In step 310, the mixer switches in the combined active subset are activated. That the selection is dynamic, i.e. varies in time, is illustrated in FIG. 14 by means of returning to step 300 from step 310. It should be noted that the flowchart in FIG. 14 is simplified. In practice, it is not a fully sequential process, but the steps 300 and 310 can, according to embodiments of the present invention, be seen as being carried out in parallel to each other. That is, during operation of the mixer unit 30 for frequency translation, there are always some mixer switches being activated (i.e. supplied with LO signal components). Hence, step 310 can, in that sense, be seen as a continually ongoing process (as long as the mixer unit 30 is operated for frequency translation), while step 300 is repeatedly executed for updating which mixer switches are currently selected for operation in which signal processing path.

The same variations and consideration that are describe above in the context of embodiments of the mixer unit 30 are applicable also in different embodiments of the method.

For example, in some embodiments of the method, the dynamic selection may be such that each active switch subset at any instant in time consists of exactly one mixer switch 70a-N.

Furthermore, in some embodiments of the method, the dynamic selection may be such that, for each one of two or more of the signal processing paths, which of the mixer switches 70a-N currently belong(s) to that signal processing path are dynamically selected in a time-periodic sequence associated with the signal processing path, wherein the time periodic sequences associated with the two or more of the signal processing paths have mutually different periods.

Moreover, in the mixer switches 70a-N may be grouped into double balanced passive mixers 100a-N as described above. In such embodiments, the dynamic selection of the active switch subsets may be such that, for each such double balanced passive mixer 100a-N each mixer switch 70J-M of that double balanced passive mixer 100a-N belongs to the combined active subset if and only if the other mixer switches 70J-M of that double balanced passive mixer 100a-N also belongs to the combined active subset, and all mixer switches 70J-M of the double balanced mixer 100a-N are then operated in signal processing paths 50a-d, 60a-d of a signal processing path group that is common to the mixer switches 70J-M of the double balanced passive mixer 100a-N. In some embodiments, the dynamic selection may be such that, for each double balanced passive mixer 100a-N, said signal processing path group common to the mixer switches 70J-M of the double-balanced passive mixer 100a-N is the same each time the mixer switches of the double balanced passive mixer 100a-N are selected for inclusion in the combined active subset. In other embodiments, the dynamic selection may be such that, for each double balanced passive mixer 100a-N, said signal processing path group common to the mixer switches 70J-M of the double-balanced passive mixer 100a-N varies in time.

According to some embodiments, the double balanced passive mixer may have the above described first and second active modes. The dynamic selection may, in such embodiments, include dynamically selecting which active mode of the first and the second active mode the double balanced passive mixer 100a-N is set to operate in. According to some embodiments of the method, the dynamic selection may be such that for each mixer switch 70a-N, every time that mixer switch 70a-N belongs to the combined active subset, that mixer switch is always operated in the same one of the signal processing paths 50a-d, 60a-d.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A mixer unit for frequency translating, based on a local oscillator, LO, signal, an input signal having one or more input signal components, said mixer unit comprising:
    an input port for receiving the input signal, wherein the input port has an input terminal for each input signal component;
    an output port for outputting a frequency translated output signal having one or more output signal components, wherein the output port has an output terminal for each output signal component;
    a signal processing path from each input terminal to each output terminal, wherein the LO signal has an associated LO signal component for each signal processing path, and the LO signal components have the same LO frequency;
    a plurality of mixer switches; and
    a control unit adapted to:
        for each signal processing path, dynamically select an associated subset, denoted as an active switch subset, of the plurality of mixer switches, for operation in the signal processing path such that which of the plurality of mixer switches belong to said active switch subset varies in time, and, at any instant in time, the union of all the active switch subsets, denoted as a combined active subset, is a strict subset of the plurality of mixer switches; and
        drive only the mixer switches in said combined active subset by, for each mixer switch in the combined active subset, supplying, to the mixer switch, the LO signal component associated with the signal processing path in which that mixer switch is operated;
    wherein the input signal is a differential input signal having a first and a second input signal component;
    wherein the input port is a differential input port comprising a first input terminal for receiving the first input signal component and a second input terminal for receiving a second input signal component;
    wherein the output signal comprises one or more differential output signal pairs, wherein each differential output signal pair comprises a first output signal component of the differential output signal pair and a second output signal component of the differential output signal pair; and wherein, for each differential output signal pair:
        the output port comprises a corresponding differential output terminal pair having a first output terminal of the differential output terminal pair for outputting the first output signal component of the differential output signal pair; and
        a second output terminal of the differential output terminal pair for outputting the second output signal component of the differential output signal pair; and
    wherein, for each differential output terminal pair, there is an associated signal processing path group of four signal processing paths, namely:
        a first signal processing path, which is the signal processing path from the first input terminal to the first output terminal of the differential output terminal pair;
        a second signal processing path, which is the signal processing path from the first input terminal to the second output terminal of the differential output terminal pair;
        a third signal processing path, which is the signal processing path from the second input terminal to the first output terminal of the differential output terminal pair; and
        a fourth signal processing path, which is the signal processing path from the second input terminal to the second output terminal of the differential output terminal pair.

2. The mixer unit according to claim 1, wherein each active switch subset at any instant in time consists of exactly one mixer switch.

3. The mixer unit according to claim 1, wherein the control unit is adapted to, for each one of two or more of the signal processing paths:
    dynamically select which of the mixer switches are currently operated in that signal processing path in a time-periodic sequence associated with the signal processing path; wherein
    the time-periodic sequences associated with the two or more of the signal processing paths have mutually different periods.

4. The mixer unit according to claim 1, wherein, for each signal processing path group:

the LO signal component associated with the first signal processing path of the signal processing path group and the LO signal component associated with the fourth signal processing path of the signal processing path group are both generated equal to a first LO signal component associated with the signal processing path group; and the LO signal component associated with the second signal processing path of the signal processing path group and the LO signal component associated with the third signal processing path of the signal processing path group are both generated equal to a second LO signal component associated with the signal processing path group; wherein the first and the second LO signal component associated with the signal processing path group together forms a differential LO signal component of the signal processing path group.

5. The mixer unit according to claim 4, wherein the output signal comprises a plurality of differential output signal pairs, and consequently a plurality of associated differential output terminal pairs and a plurality of associated signal processing path groups, wherein the differential LO signal components of the signal processing path groups have mutually shifted phases.

6. The mixer unit according to claim 5, wherein the mixer unit is a quadrature mixer unit having two differential output signal pairs, wherein one differential output signal pair is an in-phase, I, differential output signal pair, for which there are an associated I differential output terminal pair and an associated I signal processing path group, and the other differential output signal pair is a quadrature-phase, Q, differential output signal pair, for which there are an associated Q differential output terminal pair and an associated Q signal processing path group, and wherein the differential LO signal components of the I and Q signal processing paths are generated in quadrature.

7. The mixer unit according to claim 1, wherein at least some of the mixer switches are grouped into double balanced passive mixers, each comprising four mixer switches, and the control unit is adapted to dynamically select the active switch subsets such that for each such double balanced passive mixer:
each mixer switch of that double balanced passive mixer belongs to the combined active subset if and only if the other mixer switches of that double balanced passive mixer also belongs to the combined active subset, and all mixer switches of the double balanced mixer are then operated in signal processing paths of a signal processing path group that is common to the mixer switches of the double balanced passive mixer.

8. The mixer unit according to claim 7, wherein, for each double balanced passive mixer, said signal processing path group common to the mixer switches of the double-balanced passive mixer is the same each time the control unit selects the mixer switches of the double balanced passive mixer for inclusion in the combined active subset.

9. The mixer unit according to claim 7, wherein, for each double balanced passive mixer, said signal processing path group common to the mixer switches of the double-balanced passive mixer varies in time.

10. The mixer unit according to claim 7, wherein, for each double balanced passive mixer:
the double balanced mixer has a first active mode, wherein:
a first mixer switch of the double balanced passive mixer is operated in the first signal processing path of the signal processing path group common to the mixer switches of the double-balanced passive mixer;
a second mixer switch of the double balanced passive mixer is operated in the second signal processing path of the signal processing path group common to the mixer switches of the double-balanced passive mixer;
a third mixer switch of the double balanced passive mixer is operated in the third signal processing path of the signal processing path group common to the mixer switches of the double-balanced passive mixer; and
a fourth mixer switch of the double balanced passive mixer is operated in the fourth signal processing path of the signal processing path group common to the mixer switches of the double-balanced passive mixer; and a second active mode, wherein:
the first mixer switch of the double balanced passive mixer is operated in the second signal processing path of the signal processing path group common to the mixer switches of the double-balanced passive mixer;
the second mixer switch of the double balanced passive mixer is operated in the first signal processing path of the signal processing path group common to the mixer switches of the double-balanced passive mixer;
the third mixer switch of the double balanced passive mixer is operated in the fourth signal processing path of the signal processing path group common to the mixer switches of the double-balanced passive mixer; and
the fourth mixer switch of the double balanced passive mixer is operated in the third signal processing path of the signal processing path group common to the mixer switches of the double-balanced passive mixer; and the control unit is adapted to dynamically select which active mode of the first and the second active mode the double balanced passive mixer is set to operate in when the mixer switches of the double balanced passive mixer are selected by the control unit for inclusion in the combined active subset such that the active mode varies in time.

11. The mixer unit according to claim 1, wherein for each mixer switch:
every time that mixer switch belongs to the combined active subset, that mixer switch is always operated in the same one of the signal processing paths.

12. A radio receiver circuit comprising a mixer unit for frequency translating, based on a local oscillator, LO, signal, an input signal having one or more input signal components, said mixer unit comprising:
an input port for receiving the input signal, wherein the input port has an input terminal for each input signal component;
an output port for outputting a frequency translated output signal having one or more output signal components, wherein the output port has an output terminal for each output signal component;
a signal processing path from each input terminal to each output terminal, wherein the LO signal has an associated LO signal component for each signal processing path, and the LO signal components have the same LO frequency;
a plurality of mixer switches; and
a control unit adapted to:
for each signal processing path, dynamically select an associated subset, denoted as an active switch subset, of the plurality of mixer switches, for operation in the signal processing path such that which of the plurality of mixer switches belong to said active switch subset varies in time, and, at any instant in time, the union of all the active switch subsets, denoted as a combined active subset, is a strict subset of the plurality of mixer switches; and drive only the mixer switches in said combined active subset by, for each mixer switch in the combined active subset, supplying, to the mixer switch, the LO signal component associated with the signal processing path in which that mixer switch is operated;

wherein the input signal is a differential input signal having a first and a second input signal component;

wherein the input port is a differential input port comprising a first input terminal for receiving the first input signal component and a second input terminal for receiving the second input signal component;

wherein the output signal comprises one or more differential output signal pairs, wherein each differential output signal pair comprises a first output signal component of the differential output signal pair and a second output signal component of the differential output signal pair; and wherein, for each differential output signal pair:

the output port comprises a corresponding differential output terminal pair having a first output terminal of the differential output terminal pair for outputting the first output signal component of the differential output signal pair; and a second output terminal of the differential output terminal pair for outputting the second output signal component of the differential output signal pair; and wherein, for each differential output terminal pair, there is an associated signal processing path group of four signal processing paths, namely:

a first signal processing path, which is the signal processing path from the first input terminal to the first output terminal of the differential output terminal pair;

a second signal processing path, which is the signal processing path from the first input terminal to the second output terminal of the differential output terminal pair;

a third signal processing path, which is the signal processing path from the second input terminal to the first output terminal of the differential output terminal pair; and a fourth signal processing path, which is the signal processing path from the second input terminal to the second output terminal of the differential output terminal pair.

13. The radio receiver circuit of claim 12, wherein the radio receiver circuit comprises a homodyne radio receiver circuit.

14. A radio communication apparatus comprising mixer unit for frequency translating, based on a local oscillator, LO, signal, an input signal having one or more input signal components, said mixer unit comprising:

an input port for receiving the input signal, wherein the input port has an input terminal for each input signal component;

an output port for outputting a frequency translated output signal having one or more output signal components, wherein the output port has an output terminal for each output signal component;

a signal processing path from each input terminal to each output terminal, wherein the LO signal has an associated LO signal component for each signal processing path, and the LO signal components have the same LO frequency;

a plurality of mixer switches; and a control unit adapted to:

for each signal processing path, dynamically select an associated subset, denoted as an active switch subset, of the plurality of mixer switches, for operation in the signal processing path such that which of the plurality of mixer switches belong to said active switch subset varies in time, and, at any instant in time, the union of all the active switch subsets, denoted as a combined active subset, is a strict subset of the plurality of mixer switches; and drive only the mixer switches in said combined active subset by, for each mixer switch in the combined active subset, supplying, to the mixer switch, the LO signal component associated with the signal processing path in which that mixer switch is operated;

wherein the input signal is a differential input signal having a first and a second input signal component;

wherein the input port is a differential input port comprising a first input terminal for receiving the first input signal component and a second input terminal for receiving a second input signal component;

wherein the output signal comprises one or more differential output signal pairs, wherein each differential output signal pair comprises a first output signal component of the differential output signal pair and a second output signal component of the differential output signal pair; and wherein, for each differential output signal pair:

the output port comprises a corresponding differential output terminal pair having a first output terminal of the differential output terminal pair for outputting the first output signal component of the differential output signal pair; and a second output terminal of the differential output terminal pair for outputting the second output signal component of the differential output signal pair; and wherein, for each differential output terminal pair, there is an associated signal processing path group of four signal processing paths, namely:

a first signal processing path, which is the signal processing path from the first input terminal to the first output terminal of the differential output terminal pair;

a second signal processing path, which is the signal processing path from the first input terminal to the second output terminal of the differential output terminal pair;

a third signal processing path, which is the signal processing path from the second input terminal to the first output terminal of the differential output terminal pair; and a fourth signal processing path, which is the signal processing path from the second input terminal to the second output terminal of the differential output terminal pair.

15. A radio communication apparatus comprising a radio receiver circuit that includes a mixer unit for frequency translating, based on a local oscillator, LO, signal, an input signal having one or more input signal components, said mixer unit comprising:

an input port for receiving the input signal, wherein the input port has an input terminal for each input signal component;

an output port for outputting a frequency translated output signal having one or more output signal components, wherein the output port has an output terminal for each output signal component;

a signal processing path from each input terminal to each output terminal, wherein the LO signal has an associated LO signal component for each signal processing path, and the LO signal components have the same LO frequency;

a plurality of mixer switches; and a control unit adapted to:
for each signal processing path, dynamically select an associated subset, denoted as an active switch subset, of the plurality of mixer switches, for operation in the signal processing path such that which of the plurality of mixer switches belong to said active switch subset varies in time, and, at any instant in time, the union of all the active switch subsets, denoted as a combined active subset, is a strict subset of the plurality of mixer switches; and drive only the mixer switches in said combined active subset by, for each mixer switch in the combined active subset, supplying, to the mixer switch, the LO signal component associated with the signal processing path in which that mixer switch is operated;

wherein the input signal is a differential input signal having a first and a second input signal component;

wherein the input port is a differential input port comprising a first input terminal for receiving the first input signal component and a second input terminal for receiving a second input signal component;

wherein the output signal comprises one or more differential output signal pairs, wherein each differential output signal pair comprises a first output signal component of the differential output signal pair and a second output signal component of the differential output signal pair; and wherein, for each differential output signal pair:

the output port comprises a corresponding differential output terminal pair having a first output terminal of the differential output terminal pair for outputting the first output signal component of the differential output signal pair; and
a second output terminal of the differential output terminal pair for outputting the second output signal component of the differential output signal pair; and wherein, for each differential output terminal pair, there is an associated signal processing path group of four signal processing paths, namely:
a first signal processing path, which is the signal processing path from the first input terminal to the first output terminal of the differential output terminal pair;
a second signal processing path, which is the signal processing path from the first input terminal to the second output terminal of the differential output terminal pair;
a third signal processing path, which is the signal processing path from the second input terminal to the first output terminal of the differential output terminal pair; and
a fourth signal processing path, which is the signal processing path from the second input terminal to the second output terminal of the differential output terminal pair.

16. The radio communication apparatus of claim 15, wherein the radio communication apparatus comprises one of: a mobile terminal, a wireless data modem, or a radio base station.

* * * * *